(12) United States Patent
Huang et al.

(10) Patent No.: US 12,165,931 B2
(45) Date of Patent: Dec. 10, 2024

(54) METHOD AND DEVICE FOR MEASURING SEMICONDUCTOR MULTILAYER STRUCTURE BASED ON SECOND HARMONIC

(71) Applicant: SHANGHAI ASPIRING SEMICONDUCTOR EQUIPMENT CO., LTD., Shanghai (CN)

(72) Inventors: Chongji Huang, Shanghai (CN); Weiwei Zhao, Shanghai (CN); Puxi Zhou, Shanghai (CN)

(73) Assignee: SHANGHAI ASPIRING SEMICONDUCTOR EQUIPMENT CO., LTD., Shanghai (CN)

( * ) Notice: Subject to any disclaimer, the term of this patent is extended or adjusted under 35 U.S.C. 154(b) by 0 days.

(21) Appl. No.: 18/272,126

(22) PCT Filed: May 10, 2022

(86) PCT No.: PCT/CN2022/091898
§ 371 (c)(1),
(2) Date: Jul. 13, 2023

(87) PCT Pub. No.: WO2023/184649
PCT Pub. Date: Oct. 5, 2023

(65) Prior Publication Data
US 2024/0038600 A1  Feb. 1, 2024

(30) Foreign Application Priority Data

Mar. 31, 2022 (CN) .......................... 202210328447.6

(51) Int. Cl.
*H01L 21/66* (2006.01)
*G01R 31/26* (2020.01)
*G01R 31/28* (2006.01)

(52) U.S. Cl.
CPC .......... *H01L 22/14* (2013.01); *G01R 31/2603* (2013.01); *G01R 31/2831* (2013.01); *H01L 22/12* (2013.01)

(58) Field of Classification Search
CPC ..... H01L 22/14; H01L 22/12; G01R 31/2603; G01R 31/2831
(Continued)

(56) References Cited

U.S. PATENT DOCUMENTS

2002/0005952 A1 * 1/2002 Sugai ..................... G01N 21/55
356/432
2003/0021011 A1 * 1/2003 Huang ............... H04B 10/2941
359/337.1
(Continued)

FOREIGN PATENT DOCUMENTS

CN         1214116 A  *  4/1999  ......... G01N 21/9505
CN       101726496 A      6/2010
(Continued)

OTHER PUBLICATIONS

Ionica, Second Harmonic Generation for Contactless . . . , Sep. 12, 2015, Elsevier, 115, pp. 237-243 (Year: 2015).*
(Continued)

*Primary Examiner* — Hina F Ayub
(74) *Attorney, Agent, or Firm* — Bayramoglu Law Offices LLC

(57) ABSTRACT

A measuring method and device based on the second harmonic for the whole area measurement of a wafer comprises three modes: a fixed-point measurement, a scanning measurement, and a combination of the fixed-point measurement and the scanning measurement. The scanning measurement solution measures the entire wafer under the premise of ensuring high measurement efficiency, obtain the position, size and relative density distribution of electrical defects, and achieve locating and checking of abnormal points on the wafer. A new formula system is provided for describing the second harmonic signal, so that the actual measurement results and the theoretical model are unified under the three modes of the fixed-point measurement, the scanning measurement, and the combination of fixed-point measurement and scanning measurement, so that the second harmonic metrology technology is no longer only a qualitative analysis method, but also a quantitative analysis method.

65 Claims, 10 Drawing Sheets

(58) Field of Classification Search
USPC .................................................... 356/237.5
See application file for complete search history.

(56) References Cited

U.S. PATENT DOCUMENTS

| | | | |
|---|---|---|---|
| 2004/0076813 A1* | 4/2004 | Han | B23K 26/0006 |
| | | | 428/917 |
| 2012/0051507 A1 | 3/2012 | Hasegawa et al. | |
| 2020/0088784 A1* | 3/2020 | Lei | G01R 31/2601 |
| 2020/0110029 A1* | 4/2020 | Lei | G01N 21/211 |

FOREIGN PATENT DOCUMENTS

| | | | |
|---|---|---|---|
| CN | 104406942 A | | 3/2015 |
| CN | 113056814 A | | 6/2021 |
| JP | H07260702 A | * | 3/1994 |
| JP | 2003109985 A | | 4/2003 |

OTHER PUBLICATIONS

I. Ionica, et al., Second Harmonic Generation for non-destructive characterization of silicon-on-insulator substrates, EUROSOI-ULIS 2015: 2015 Joint International EUROSOI Workshop and International Conference on Ultimate Integration on Silicon, 2015, pp. 185-188.

* cited by examiner

METHOD AND DEVICE FOR MEASURING SEMICONDUCTOR MULTILAYER STRUCTURE BASED ON SECOND HARMONIC

CROSS-REFERENCES TO THE RELATED APPLICATIONS

This application is the national phase entry of International Application No. PCT/CN2022/091898, filed on May 10, 2022, which is based upon and claims priority to Chinese Patent Application No. 202210328447.6, filed on Mar. 31, 2022, the entire contents of which are incorporated herein by reference.

TECHNICAL FIELD

The invention relates to the measurement of a semiconductor device in the manufacturing or treating process, mainly to measure or monitor the interface characteristics or the quality of an oxide layer of the semiconductor wafer through the second harmonic.

BACKGROUND

In the process of semiconductor wafer processing, it has always been an important step to detect the quality of the interfacial region between the oxide layer and the semiconductor layer. This is because the interface state and bulk charge of the oxide layer existing at the interfacial region will cause device threshold voltage instability, leakage and other phenomena by trapping or releasing charge carriers, which greatly reduces the performance and service life of the device.

At present, the main methods commonly used in the industry to quantitatively characterize such electrical properties are the conductance method and the capacitance method. The principle is that such electrical characteristics all affect the flat-band voltage of a device. However, the method or mechanism of their influence is different, so that the measured results deviate from the theoretical C-V curve or I-V curve. Therefore, by applying a bias voltage to the test sample to measure its current or capacitance signal, and by analyzing a deviation degree between the actual measurement results and the theoretical results, the electrical characteristics of the sample being tested can be calculated quantitatively. However, these methods not only have low efficiency and low resolution, but also cause damage to wafer, which has gradually failed to meet the requirements of high efficiency, high resolution and low material loss in advanced manufacturing process.

Second harmonic is a nonlinear effect, which means that under certain conditions, a material can emit light with a frequency twice that of the incident light. At present, some papers have found that second harmonic has high sensitivity in the quality detection of the surface/interface where the inversion symmetry of the intrinsic material is broken, in particular, it has a unique application value as a qualitative analysis method in the field of quality detection mainly based on silicon semiconductor. Moreover, the measurement process is extremely convenient, and the second harmonic signal can be received only by injecting photons at the measurement point. However, in the current actual wafer production and processing, the value of the second harmonic technology is very limited, mainly due to the following three reasons:

1) In the current measurement technology, it is difficult to unify the actual measurement results with the theoretical model, which makes it impossible to decouple the various factors that generate the second harmonic. This is also a main reason why this technology is currently only used as a qualitative analysis method rather than a quantitative analysis method.
2) current technologies or theoretical models cannot perform a whole area measurement on the wafer under the premise of ensuring high measurement efficiency.
3) The accuracy of the existing second harmonic detection equipment is not enough, especially the measurement accuracy of the initial value as one of the most important parameters is not enough, which leads to errors of the results when analyzing the sample parameters according to this value.

SUMMARY

Technical Problems to be Solved by the Present Invention 1) current measurement technology cannot measure a wafer in the whole area and locate and check abnormal points of wafer under the premise of ensuring high measurement efficiency.
2) in the current measurement technology, it is difficult to unify the actual measurement results with the theoretical model, and only a qualitative analysis can be done on the measurement results, rather than a quantitative analysis.
3) in the current measurement technology, the measurement accuracy of an initial value is not enough, resulting in the error of the analysis results.

At present, the status of second harmonic used in wafer defect detection technology is as follows: in the past 20 years, a fixed-point measurement has received a certain amount of attention, and it is mainly the theoretical modeling and application expansion of the second harmonic in wafer detection by scientific research institutions. However, industrial applications require the technology to have high defect analysis accuracy and defect locating capabilities, which is the reason why the current second harmonic wafer inspection technology has not been applied in industry. In this case, the present patent has created a unique second harmonic scanning technology that can improve the measurement accuracy of second harmonic and can achieve the defect distribution analysis which cannot be achieved by the fixed-point mode and proposes a new theoretical model which can be applied to both the fixed-point mode and the scanning mode and the corresponding device structure.

The present invention provides a measuring method based on second harmonic for a whole area measurement of a wafer and provides a device structure to achieve the measuring method. The measuring modes of the method and device comprise three modes: a fixed-point measurement, a scanning measurement, and the combination of a fixed-point measurement and a scanning measurement. A fixed-point measurement has been used in the current measurement technology. A scanning measurement has not been applied in the field of second harmonic and belongs to an original creation of the present invention. The scanning measurement method provided by the present invention can control the shape, size and light intensity of the light spot, monitor and adjust the height of the measured point in real time during the measurement process, so as to achieve the whole area measurement of the wafer under the premise of ensuring high measurement efficiency, and achieve the locating and checking of abnormal points on the wafer.

In addition, the present invention provides a correspondence between a fixed-point measurement and a scanning measurement and achieves a deep combination of these two modes. The combination mode of the fixed-point measurement and the scanning measurement of the present invention can not only reduce the noise of the data result of the fixed-point measurement through an accurate initial value measured by the scanning mode, but also can reprocess the data of the scanning mode through the results of the fixed-point measurement mode, still can carry out a fixed-point measurement for the abnormal point of the wafer after the abnormal point is checked and located by the scanning measurement. Further, by controlling the light intensity distribution and the scanning speed of the light spot, the present invention endows the scanning measurement with a separate "detection" function, that is, under the circumstance of the internal charge distribution of the sample hardly changing, and the measured signal only relating to the initial state of the measured area, the detection of the sample is achieved. This method can also be used to increase the accuracy of this initial value. Furthermore, the measurement method of the present invention also makes a breakthrough in data analysis, establishes a theoretical model combined with the actual sample structure, and establishes a more accurate theoretical formula system, so that the actual measurement results and the theoretical model are unified under the three modes of a fixed-point measurement, a scanning measurement, and the combination of a fixed-point measurement and a scanning measurement. According to the theoretical model of the present invention, the second harmonic metrology technology is no longer only a qualitative analysis method, but also can be applied as a quantitative analysis method.

At present, there are two main scanning modes for semiconductor defect detection: physical scanning and microscopic imaging scanning. However, these scans can only probe the surface of the sample or a few nanometers below the surface, and the main detected objects are physical defects in these areas such as scratches, metal particles, etc. However, the present invention is based on an optical scanning of second harmonic, which is to detect the electrical defects of the sub-surface and the membrane, such as the bulk charge and the interface state. There are still no scanning devices capable of locating such electrical defects. The original second harmonic scanning technology of the present invention not only fills the gap of the second harmonic metrology technology and makes the scanning measurement method get a new application in the field of second harmonic, but also makes it possible to identify and locate the electrical defects on the sub-surface and in the membrane.

In addition, the present invention provides a correspondence between a fixed-point measurement and a scanning measurement and achieves a deep combination of these two modes. The difference between these two modes in the form of electronic emitting can be illustrated in FIG. 1. Since the light intensity of the light spot is Gaussian distribution, the emitted electrons in the irradiated area also present a Gaussian distribution during a fixed-point measurement. Therefore, the signal value of the second harmonic contributed by each part of the area will be different. However, in a scanning mode, although the light intensity of the light spot is still Gaussian distribution, but in a direction of wafer movement, the total time of all measurement points being irradiated is the same as the total number of injected photons, and the laser-induced internal charge redistribution is uniform, if the electrical property of the tested wafer are relatively uniform, then the second harmonic signal value must be roughly the same everywhere. Therefore, the "second harmonic signal-coordinate" curve in the scanning measurement mode can be used as a characterization method for the uniformity of the sample in the whole area. But under the circumstance of the same light spot size and light intensity, there is a correspondence between the two measurement modes.

By adjusting the relative moving speed and changing the total duration of laser irradiation in the measured area, the matching between a scanning mode and a fixed-point measurement mode can be achieved, and the corresponding relationship is $$t_s = \frac{D_s}{v},$$

Wherein $t_s$ is a duration of the laser irradiation of the specified measuring point on the sample under the fixed-point measurement mode, $D_s/v$ is a duration of the laser irradiation of the scanning measuring point on the sample under the scanning measurement mode, v is a relative moving velocity, $D_s$ is an equivalent size of the spot.

A concept of equivalent size can be used to deal with the situation that the shape of the light spot projected on the sample is not circular (such as an ellipse) in actual measurement. Usually, the shape is centrosymmetric with a major axis D, and can be described by a formula of $y=f(x)$. Then for a non-circular spot with the light intensity density of $I(x,y)$, the equivalent size of the light spot can be calculated by the following formula $$D_s^2 = \frac{8}{\pi} * \frac{\int_{-D/2}^{D/2} f(x) * I(x, f(x)) * dx}{\int_{-D/2}^{D/2} I(x, f(x)) * dx}$$

when $$v \geq \frac{D_s}{T}$$

(T is a counting period of a signal receiver), a total length of each measurement point being irradiated does not exceed one counting period, which is short enough (generally in a range of [0.1 ms, 1 ms]), so the internal charge distribution of the wafer at the measured point does not change yet and can be used to characterize an initial state of the wafer. For a fixed-point measurement, since there is a delay between a complete laser irradiation time and a signal collection time (generally within a range of [15 ms, 30 ms]), at the moment corresponding to an initial value of a fixed-point measurement, the inside of the wafer has already changed. Therefore, a scanning measurement mode can greatly improve the accuracy of an initial value and can be used to reduce noise and correct the fixed-point measurement results.

It should be added that the concept of the equivalent size is introduced here for the convenience of description, and the present technical solution is not limited to the use of the equivalent size. If other parameters used to characterize the size of the light spot are used, it is an equivalent replacement of the present technical solution. Here, what is important is an establishment of the correspondence between the fixed-point measurement and the scanning measurement, rather than the change of the specific method when achieving the corresponding relationship.

When the scanning speed is slow enough, each measurement point of the wafer is irradiated by the laser for a long enough time (for example, more than 10 s), so its internal charge distribution has reached a dynamic equilibrium state, which corresponds to a final state of a fixed-point measurement.

The combination of a fixed-point measurement and a scanning measurement of the present invention can also carry out a fixed-point measurement on the abnormal points after the abnormal points of the wafer are checked and located by a scanning measurement.

Further, the present invention endows a scanning measurement with a separate function of "detection" by controlling the shape, size, light intensity and scanning speed of the light spot, that is, under the situation of the internal charge distribution of the sample hardly changing, and the measured signal only relating to an initial state of the region being measured, the detection of the sample is achieved.

In common second harmonic measurement techniques, a laser light source serves two purposes: probing or emission.

"Probing" means that the light wave emitted by the light source will couple with the structure with non-central symmetry to generate a second harmonic signal. Lattice defects (such as interface states, fixed charges, impurity atoms, etc.) are usually a coupling center, so the generated second harmonic signal can be used to characterize the lattice defect density of a sample.

"Emission" means that the photons injected by an incident light in the detection region are absorbed by the electron, so that the bound electron in the valence band of the sample semiconductor layer may obtain enough energy to be emitted into the semiconductor conduction band and become free electrons. The electron may be trapped by an interfacial defect or absorb more photons so that it has enough energy to cross the potential barrier and reach the oxide layer. Finally, a large accumulation of charges is formed at the interface or surface of the sample, which is called electron accumulation. Its essence is to generate more defects, so that a second harmonic can be "probed".

Two functions of a laser can be said to be inseparable. "Emission" can continuously change an internal charge distribution state of a sample being tested, while "probing" can characterize this continuous change of the sample. Therefore, the sample with layered structure can be measured and analyzed by long time collecting signals at the measurement point.

However, in order to probe the electrical properties of a sample in an initial state, it is necessary to be able to achieve a purpose of "probing" or "excitation" alone, which is difficult to achieve in current measurements. This is because the photons of a probe source itself will also cause an energy level transition of the electrons. Even if a probe source with a low power is selected (which will cause a low measurement signal and large noise), the charge distribution inside the sample will still change after a long time of irradiation. Therefore, we have no way of knowing how much energy in the "probe" source is absorbed by the sample for ionization and excitation of electrons, and how much energy is used to generate the second harmonic. On the other hand, due to a time delay between the generation and reception of the second harmonic, which leads to a deviation between the time when the signal is collected and the time when the area is actually irradiated in a fixed-point measurement. At the same time, it also caused the deviation between the measured results and the theoretical results. And this signal error due to the delay interval ($\Delta t$) can be evaluated by the following formula.

$$Eor = \frac{f(\Delta t) - f(0)}{f(0)} \approx \frac{f'(0)}{f(0)} * \Delta t$$

In the scanning measurement method provided by the present invention, as previously analyzed, a total energy and a total duration of laser irradiation in the scanned area are the same, and the duration is $$t_s = \frac{D_s}{v},$$

which greatly reduces the influence of delay errors. Therefore, the scanning mode has a natural advantage when used to measure specific second harmonic signal values, for example, for the measurement and noise reduction of an initial value of second harmonic.

An initial value of second harmonic can be used to characterize a state of the sample when it does not change. However, due to a time delay between signal excitation and measurement in a fixed-point measurement, it leads to certain errors in a fixed-point measurement. However, due to the scanning mode at any measurement point on the sample, the duration of being hit by the laser $$t \leq \frac{D_s}{v},$$

$D_s$ is an equivalent size of the light spot in the scanning direction and v is a relative moving speed.

By setting a spot size and relative moving speed reasonably, the time value can be controlled in a small range, such as [0.1 ms,1 ms]. In this time range, the internal charge distribution of the sample hardly changes, and the measured signal is only related to an initial state of the region being measured. This is a fundamental reason that the scanning measurement method of the present invention can achieve a separate "measurement" of an initial value.

Furthermore, the measurement method of the present invention also makes a breakthrough in data analysis. By establishing a more accurate physical model and a more perfect theoretical formula system, the actual measurement results and the theoretical model are unified under the three modes of a fixed-point measurement, a scanning measurement, and the combination of a fixed-point measurement and a scanning measurement, so that the second harmonic measurement technology is no longer a qualitative analysis method but can be used as a quantitative analysis method. Next, take the two-layer structure described in FIG. 2 as an example. The sample structure described in FIG. 2 is a common semiconductor double-layer structure: an oxide layer—semiconductor layer structure, but the application scope of the present invention is not limited to double-layer, or semiconductor materials. In practical application, the data analysis method should be modified according to the structure of a sample under test (such as the number of layers, layer thickness, film material, reflectivity, etc.). For example, when the test object is a sample of other semiconductor materials, the material properties of the material should be used to recalculate the relevant items in each formula, such as Debye length, penetration depth, etc.

In FIG. 2, there are defects such as interface state (i.e. dangling bond) and bulk charge exist near the interface of the sample with a double-layer structure. By selecting an appropriate wavelength of incident light, the bound electrons in the medium layer have little chance to be ionized; while the photon penetrates the upper medium and reaches the interface, the electrons in the valence band of the space charge region (the region near the interface in the semiconductor layer) can absorb the energy of a single photon and transit to the conduction band, thus become free electrons and gradually accumulate at the interface. Some of the free electrons will be captured by the interface state and become bound electrons, while the other unabsorbed electrons may transit to the conduction band of the upper medium after absorbing more photon energy. Under the dual action of concentration gradient and a build-in electric field, these electrons move in the upper medium and have the chance to be captured by the bulk charge. Eventually, some of the electrons will reach the surface and get captured by the surface state. During the entire process from electron ionization to electron capture by the surface, the internal charge distribution of the sample changes accordingly, and the built-in electric field at the interface changes accordingly too, until finally a new equilibrium is reached. Therefore, the second harmonic signal also shows a trend of changing over time and eventually reach a stable trend (FIG. 3B), which is the reason why the second harmonic technology can be used to characterize electrical defects related to the internal charge distribution, such as interface state and fixed charges, and so on.

A general formula for second harmonic is $I_{2\omega}=|\chi^{(2)}+\chi^{(3)}e^{i\varphi}E_{dc}(t)|^2I_\omega^2$. Wherein, $\chi^{(2)}$ and $\chi^{(3)}$ are a second/third order polarization tensors of a sample, $I_w$ is a light intensity of a measuring point, $E_{dc}(t)$ is a built-in electric field at the interface, and φ is a phase difference of the two terms. However, due to the fact that the light intensity in the measurement process is not uniformly distributed but Gaussian distribution, and the variation of the electric field intensity in the measurement area is different, therefore, there is a large gap between the theoretical basis of the formula and the actual measurement situation, which makes the actual measurement results and the theoretical model cannot be unified, therefore an effective quantitative calculation of the measurement results cannot be carried out. Aiming at the aforementioned problems, the present invention further deduced the formula, and the following Formula 1 is obtained:

$$\sqrt{SH(2\omega)}=\iiint_0^{D_s/2}\int_{-L_D}^0 I(r,\theta)[\chi^{(2)}\delta(z)+\chi^{(3)}E_{dc}(r,t)] \, rdzdrd\theta \quad \text{(Formula 1)}$$

In Formula 1, $\chi^{(2)}$, $\chi^{(3)}$, respectively, are a second and third order polarization constants of a sample to be measured, $D_s$ is an equivalent size of the light spot, $L_D$ is Debye length, (r,θ) is the polar coordinate position with the center of the light spot as the origin; z is the distance of the light spot from the interface to be measured in the vertical direction; t is a duration of the measuring point being irradiated by the laser.

In Formula 1, I(r,θ) is Gaussian light intensity distribution of the light spot, which can be described by Formula 2 as follows:

$$I(r,\theta)=\frac{2P}{\pi w^2}\exp\left(-\frac{2r^2}{w^2}\right) \quad \text{(Formula 2)}$$

P in Formula 2 is a peak power of the laser and w is a beam waist width.

$E_{dc}$(r,t) in Formula 1 is a built-in electric field at the interface to be measured, which can be described by Formula 3 as follows:

$$E_{dc}=-\frac{\sqrt{2}kT_e}{qL_D}\exp\left(-\frac{q(V_g-V_{FB})}{2kT_e}\right)+\frac{qN\alpha^{-1}}{\varepsilon_s\varepsilon_0} \quad \text{(Formula 3)}$$

In Formula 3, q is an electron charge constant, k is Boltzmann constant, $T_e$ is an ambient temperature, $V_g$ is an external bias voltage applied by the bias voltage device, $V_{FB}$ is an flat band voltage, N is a volume charge density, $\alpha^{-1}$ is a penetration depth of the second harmonic signal in the semiconductor layer, $\varepsilon_s$ is a dielectric constant of the semiconductor layer, $\varepsilon_0$ is a vacuum dielectric constant.

In Formula 3, a form of a built-in electric field under an applied bias voltage is introduced. This is because the flat-band voltage of the tested sample is not zero due to the existence of various defects. Therefore, it is necessary to consider the second harmonic signal contributed by flat-band voltage in quantitative calculation. The present invention, by adding an external voltage device, an initial state of the tested sample before being irradiated by laser can be changed pertinently, so as to achieve a purpose of accurate measurement. For example, if a bias voltage of the same magnitude and opposite direction as the flat-band voltage is applied at the same time, so that an initial built-in electric field of the sample under test is zero, the second harmonic signal generated at this time will reach a minimum value.

FIG. 3A-3D list several second harmonic curves that may appear in actual fixed-point measurement. For this kind of data curve, the corresponding electrical information can be obtained by fitting the above formula system. In an entire second harmonic curve, there are three signal points that attract the most attention, respectively corresponding to the three states of the measured sample:

Initial state point: characterizes a state of the sample before photon injection, namely the first point in FIG. 3A-3D. At this time, no free electrons have been excited into the oxide layer, and the built-in electric field is an initial built-in electric field.

Time-varying state point: characterizes a dynamic process of charge redistribution in the sample after photon injection, reflecting a process of electron capture by interface state or bulk charge. This is reflected in the changing line segment in the middle in FIG. 3A-3D. During this process, the built-in electric field changes, and produces a time-varying second harmonic signal. Several different time-varying states are listed in the figure, such as the monotonically increasing trend in FIGS. 3A and 3B, the trend of first decreasing and then increasing in FIG. 3C, and the trend of first increasing and then decreasing in FIG. 3D. These different second harmonic changing trends represent different initial state and defect density of the sample, which is an important basis for a quantitative calculation of defect density. In addition, the rate of signal change is related to the thickness of the oxide layer, the band gap width of the material and the frequency of the incident photon, etc. Taking silicon as an example, Formula 4 can be used to calculate a growth rate of the second harmonic curve when an interface charge density is σ.

$$\frac{1}{\tau_g(\sigma)} = \frac{1}{\tau_g(0)}\left[1 - \frac{e^2\sigma D_{eff}}{\varepsilon_{Si}(n\hbar\omega - \emptyset_{ox})}\right]$$ (Formula 4)

Wherein, $\varepsilon_{Si}$ is a dielectric constant of silicon, n is the number of photons absorbed by an electron energy level transition, $\hbar$ is a reduced Planck constant, ω is an angular frequency of light, $\emptyset_{ox}$ is a band gap width of the oxide layer, e is an electron charge constant, σ is an interface charge surface density, $D_{eff}$ is an oxide layer thickness. It can be seen from Formula 4 that when an oxide layer thickness exceeds a threshold, Formula 4 approaches 0, and the second harmonic signal generated will no longer change over time.

Final state point: characterizes a state of the sample after photon injection and reaching stability or a state at the end of measurement time. The so-called stable means that, within the measurement time, the charge distribution inside the sample reaches a dynamic equilibrium, that is, the excitation rate of free electrons is equal to the recombination rate of electron hole pairs, and the built-in electric field does not change. After that, even if the measurement time is extended, the signal value will not change significantly again, which is reflected in the line segment after signal stabilization in FIG. 3B. However, in the case of using a low power excitation light, it is possible that the sample still does not reach a stable state at the end of the measurement, and thereafter if the measurement time is extended, the second harmonic signal will still show a tendency to change over time. In this case, the last point measured can be defined as a final state, as the last point marked in FIG. 3A.

The aforementioned Formula 1, Formula 2, Formula 3 and Formula 4 provided by the present invention are used to calculate, in the three modes of a fixed-point measurement, a scanning measurement, and a combination of a fixed-point measurement and a scanning measurement, the actual measurement results and the theoretical model have been unified, so that the second harmonic metrology is no longer just a qualitative analysis method, but can be applied as a quantitative analysis method.

In order to minimize the noise, the present device has taken three measures in total excitation light fluctuation noise reduction; S exit optical path noise reduction; scanning measurement signal denoises fixed-point measurement signal.

The so-called excitation light fluctuation noise reduction means that in one of the exit optical paths, a beam of splitting light before the incident light reaches the wafer is collected, cooperating with the camera system to monitor the shape and size of the spot, it can be used to monitor the intensity density of the light spot, monitor the stability of the incident light, and denoise the second harmonic signal.

S exit optical path noise reduction is based on a theory of second harmonic. In the case of zero azimuth angle, when a polarization direction of the incident optical path is P, theoretically no second harmonic in the S direction will be generated. However, in the actual measurement, due to a small deviation of azimuth angle or polarizer angle, or affected by other interference factors, the second harmonic signal of S exit optical path is not necessarily zero. Therefore, this signal value can be used to denoise the P exit optical path. It is worth mentioning that the optical path is not only used for noise reduction, but also, in fact, when adjusting the azimuth measurement, the second harmonic signal in the S direction is also meaningful in analyzing the lattice symmetry or defects of the sample.

The use of scanning measurement signal denoises fixed-point measurement signal is based on the previous interpretation of scanning mode. Because in a fast-scanning measurement, the laser irradiation time of each measurement point is very short, which does not affect the internal charge distribution of the wafer, therefore the scanning process can be repeated on the same scanning path, and then averaging each measurement result can greatly reduce the noise of scattered particles. In addition, since the signal value obtained by a fast-scanning mode is closer to an initial value, that is, the initial value, therefore, the value obtained by the mode can be used for the noise reduction of the initial value in the fixed-point measurement.

To achieve the above-mentioned measuring purpose, the present invention also provides a measuring device as shown in FIG. 4 and a series of improvement solutions for the device. Wherein, the device comprises a light source, an incident light path system, a sample, a carrier platform, an exit light path system, a signal receiving system, a monitoring system, an input system, a display system and a central processing system. FIG. 4 shows only part of the structure.

The present invention has the following beneficial effects:

The present invention provides a measuring method based on second harmonic for the whole area measurement of a wafer and provides a device structure to achieve the measuring method. The measurement solution comprises a fixed-point measurement, a scanning measurement, and the combination of a fixed-point measurement and a scanning measurement. The scanning measurement solution provided by the present invention can, under the premise of ensuring high measurement efficiency, measure the wafer in the whole area, obtain the position, size and relative density distribution of electrical defects, and achieve the locating and checking of wafer abnormal points, which cannot be achieved by previous second harmonic metrology. The previous second harmonic technique could not measure the same point repeatedly in a short time because of the hysteresis effect. In the scanning measurement solution provided by the present invention, the laser strikes the measuring point for a very short time and has almost no impact on the wafer, therefore, repeated measurement can be achieved, and the measurement accuracy is greatly improved. The combination mode of the fixed-point measurement and the scanning measurement provided by the present invention provides a corresponding relationship between a fixed-point measurement and a scanning measurement, and the method of a fixed-point measurement for the abnormal point of the wafer after checking and locating the abnormal point of the scanning measurement, achieve a deep combination of the two modes. Further, the present invention endows the scanning measurement with a function of separate "probing", which can achieve a separate probing of the sample when an initial state of the sample is studied. Furthermore, the present invention provides a new formula system for describing the second harmonic signal, so that the actual measurement results and the theoretical model are unified in the three modes of a fixed-point measurement, a scanning measurement, and the combination of a fixed-point measurement and a scanning measurement, so that the second harmonic metrology technology is no longer only a qualitative analysis method, but also can be applied as a quantitative analysis method. In addition, combining the theory of a fixed-point measurement and a scanning measurement, the present invention provides a noise reduction processing solution in both the device and the analysis method, greatly improving a signal-to-noise ratio of the measurement results. In summary, the measuring method and measuring device provided by the present invention have greater improvement in the measuring speed and higher efficiency, and under the premise of ensuring an efficiency, improve the comprehensiveness and accuracy of product detection, improve the quality inspection ability in the advanced semiconductor manufacturing process, and provide reliable reference information for improving the product yield and further improving the process. Moreover, the technical solution provided by the present invention does not require any pre-treatment or post-test treatment of the test sample, does not require any discharge of waste water and waste gas, and has no pollution to the environment.

BRIEF DESCRIPTION OF THE DRAWINGS

In order to more clearly illustrate the technical solutions of the embodiments of the present invention, the attached drawings required to be used in the embodiments or in the description of the prior art are briefly introduced below. Obviously, the attached drawings described below are only some embodiments of the present invention, for ordinary technical personnel in the field, without creative labor, other drawings can be obtained from these drawings.

DETAILED DESCRIPTION OF THE EMBODIMENTS

Figure 1:
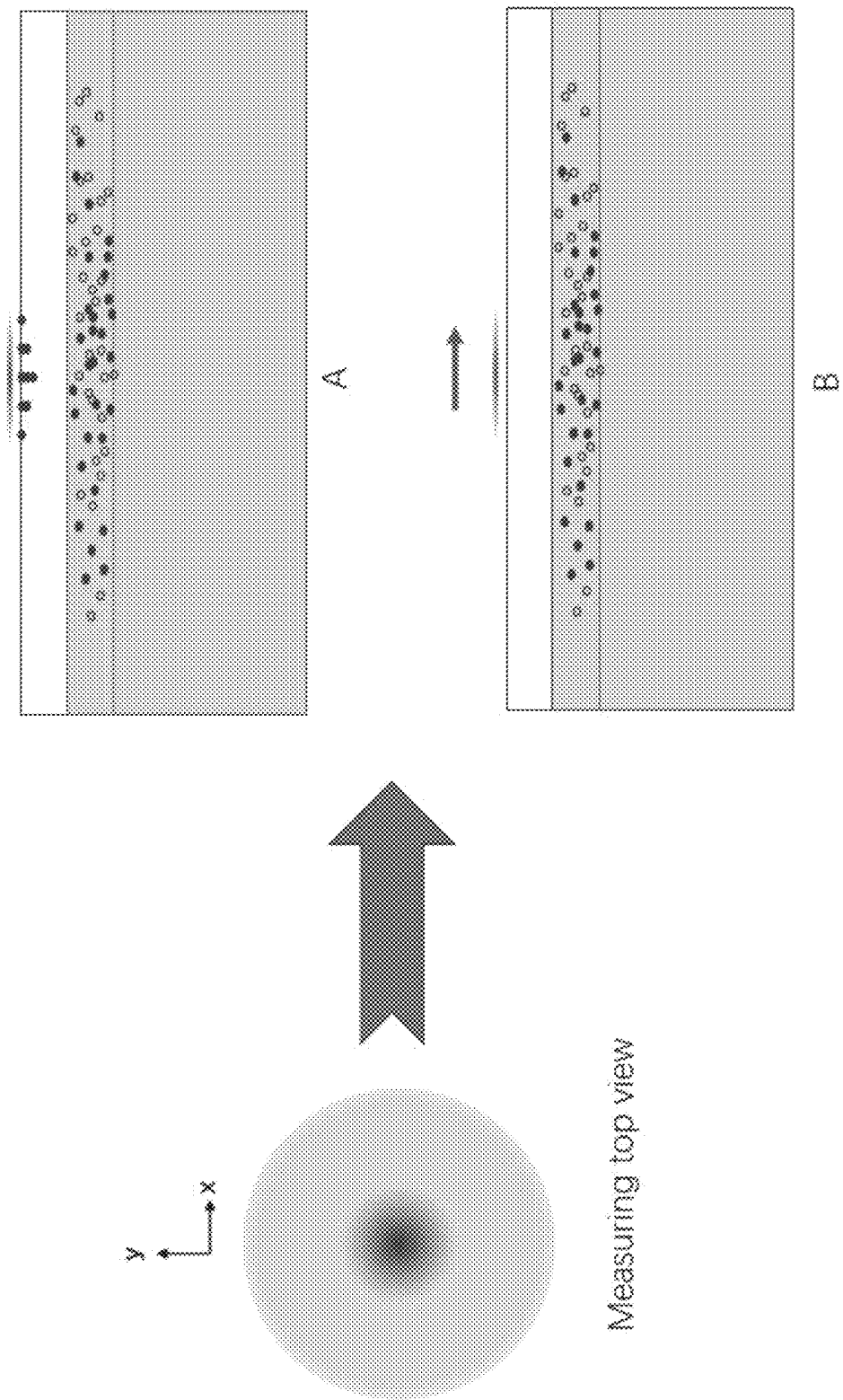
FIG. 1 is a principle distinction diagram of a fixed-point measurement and a scanning measurement of a specific embodiment of the present invention: a measurement device for quality monitoring of a semiconductor multilayer structure based on second harmonic.
Figure 2:
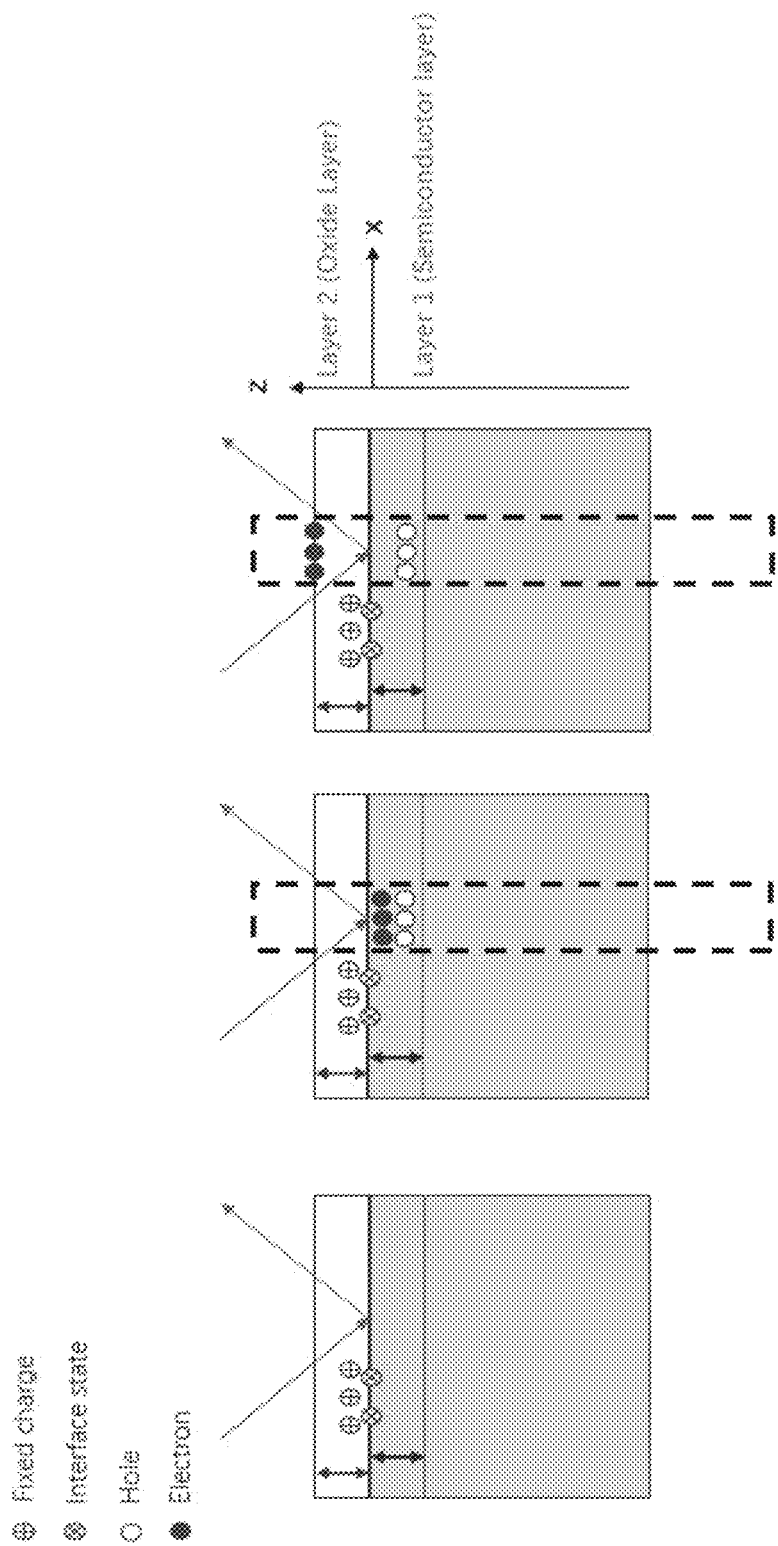
FIG. 2 is a schematic diagram of the internal charge distribution of the sample of the double-layer structure of a specific embodiment of the present invention: a measuring method for quality control of a semiconductor multilayer structure based on second harmonic.
Figure 3A:
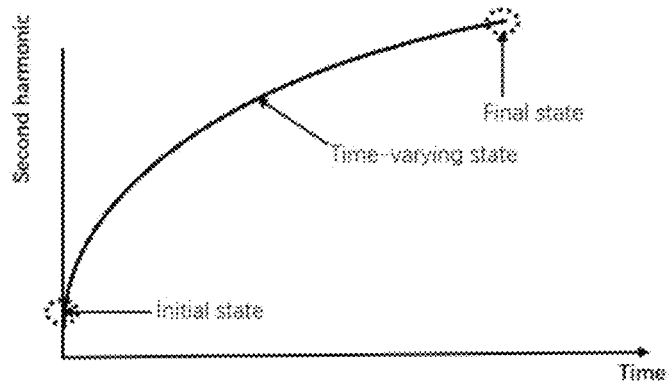
FIG. 3 is a fixed-point measurement signal diagram of a specific embodiment of the present invention: a measuring method for quality control of a semiconductor multilayer structure based on second harmonic.
Figure 3B:
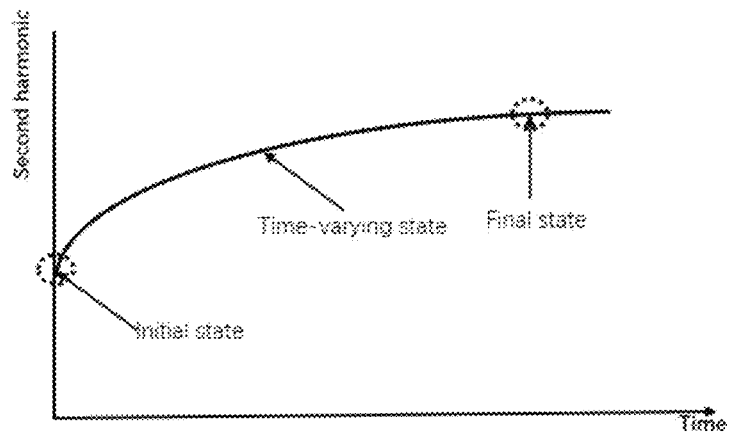
Figure 3C:
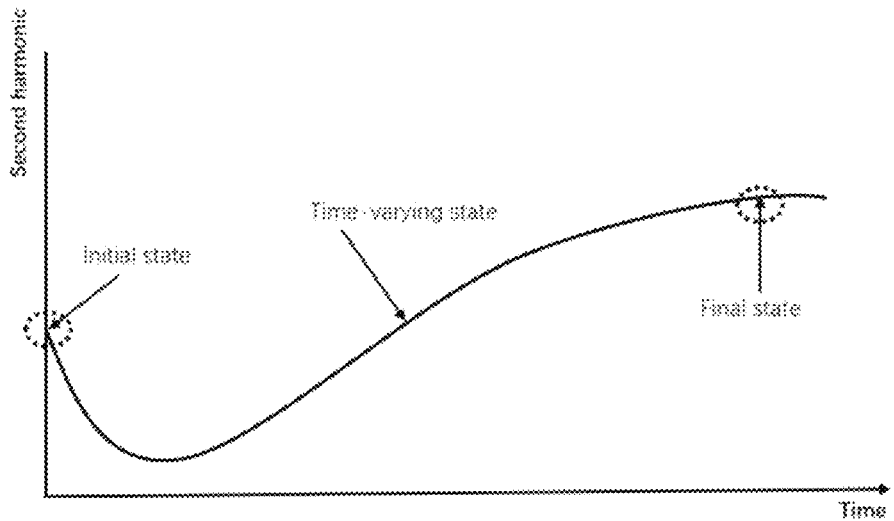
Figure 3D:
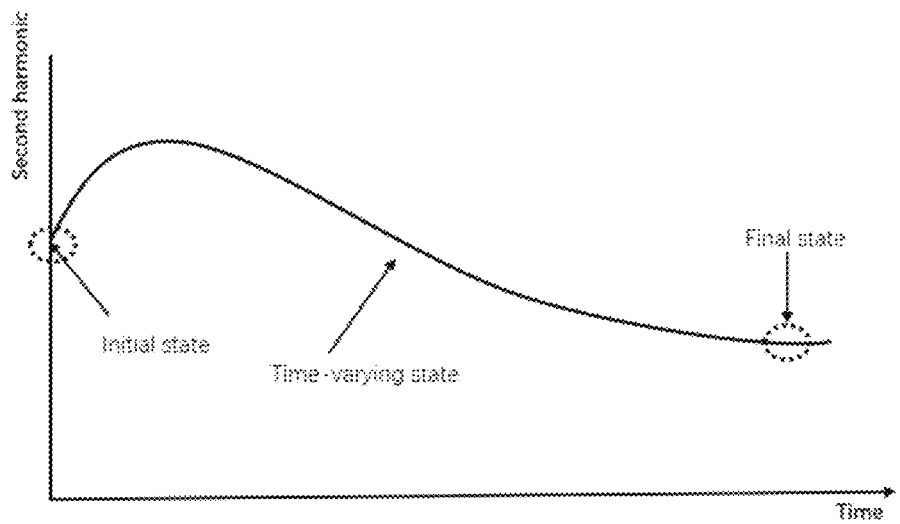

The term "and/or" in this article is just an association relationship describing associated objects, which means that there can be three relationships, for example, A and/or B can mean A exists alone, A and B exist simultaneously, and B exists alone these three situations.

The technical solutions in the embodiments of the present application will be clearly and completely described below in combination with the drawings attached in the embodiments of the present application. It should be understood by a person skilled in the field that the described embodiments are some, but not all, embodiments of the present invention. Based on the embodiments in the present application, a person skilled in the field can make any appropriate modifications or variations to obtain all other embodiments.

In the first aspect, an embodiment of the present invention proposes a method for measuring a semiconductor multilayer structure based on second harmonic, the method comprising:
  a light source emits a laser, passes through an incident optical path system, forms a light spot on a sample, and injects photons into the sample, that is, carries out a laser irradiation on the sample;
  the sample is a detectable structure consisting of more than 2 layers of substance, at least one layer of the substance is a semiconductor layer, the light source can reach an interface to be probed, namely, the interface to be probed;
  the sample and the light spot can have a relative movement on a plane, a relative movement speed of the relative movement is v, v≥0; when the method enters a fixed-point measurement mode, that is, when a specified measurement point is measured, v=0; when the method enters a scanning measurement mode, v>0, a direction of the relative movement is a scanning direction;
  during a scanning measurement process of a same batch of the sample, a shape and size of the light spot remain constant; a power of the light source remains constant, that is, when the shape and size of the light spot remain constant, a light intensity of the light spot also remains constant; the relative moving speed of the sample and the light spot remains constant;
  when the photon is absorbed by an electron and an internal charge distribution of the sample changes, a change curve of the second harmonic signal received by a signal receiver through an exit optical path system can be described as a second harmonic signal formula; the second harmonic signal is a filtered light of a single wavelength, and an exit angle is the same as an incidence angle;
  the change curve of the second harmonic signal, comprising the following information:
  when entering the fixed-point measurement mode, the time variation characteristics of the second harmonic signal generated by the specified measuring point are recorded;
  When entering the scanning measurement mode, the spatial distribution characteristics of the second harmonic signal generated by the scanning measuring point in the process of the relative movement are recorded.

In this embodiment, the light source achieves a function of separate probing. In a general second harmonic measurement technology, both "probing" and "excitation" are carried out simultaneously. This is because the photons of the probing source itself will also cause an energy level transition of electrons. Even if a low-power probing source is selected (which itself will cause a low measurement signal and a large noise), after a long-term irradiation, still cause changes in the internal charge distribution of the sample. A scanning method provided by the present embodiment can effectively achieve "probing" without changing the internal charge distribution of the sample. By controlling the shape, size, light intensity and scanning speed of the light spot, the scanning method provided in the present embodiment endows a scanning measurement with a function of separate "probing", that is, under the circumstance of the internal charge distribution of the sample hardly changing, and the measured signal only relating to the initial state of the measured area, the detection of the sample is achieved. Therefore, the light source is truly a single-purpose light source based on technical means. Of course, in a fixed-point measurement, the light source can also perform probing and excitation at the same time.

A laser passes through an incident optical system to form a light spot on the sample. The area of the light spot will affect the number of incident photons per unit area (light intensity density). Under the same power, the smaller the light spot area, the more concentrated the incident photons, and the greater the impact on the sample during the measurement process, but at the same time, the higher the resolution of the system device.

The sample is a probing structure with an interface consisting of more than two layers of substances, at least one layer of substances is a semiconductor layer. The technical solution of the present embodiment probes an interface state of a semiconductor, therefore, one of the substances being probed must be a semiconductor and must be composed of more than two layers, otherwise the so-called "interface" cannot be formed. The structure of the semiconductor material, comprising common semiconductor materials (such as Si, Ge, SiC, GaN, etc.), new oxide semiconductors (such as ZnO, CdO, $Fe_2O_3$, etc.), one-dimensional semiconductors (such as graphene, black phosphorus, etc.) and other semiconductor materials (such as diamond, etc.). The light source should be able to reach the interface to be probed, which mainly limits the thickness of each layer of the sample being tested (especially a material layer with a large absorption coefficient). If the material layer that the light source needs to penetrate is too thick or the absorption coefficient is too large, so that not enough photons reach the interface to be measured, the probing function cannot be achieved. In the case of patterned samples, a surface area of the test area is also required to be larger than the light spot size.

A relative movement of the sample and the light spot on a plane may be that the sample is moving, the light spot is moving, or both are moving. When carrying out a fixed-point measurement mode, the relative movement speed v=0. After one point is measured, the next point can be measured. During the process of moving to the next measurement point, the light source is switched off. When entering a scanning measurement mode, v>0.

In a scanning measurement mode, it is necessary to keep the power of a light source stable. An value of the second harmonic signal is proportional to the square of a light intensity, so in an actual scanning measurement, a stability of the light intensity must be guaranteed (that is, a stability of the power, light spot shape, and size), otherwise the data in a scanning second harmonic signal cannot be known whether the fluctuation is caused by a change of the electrical characteristics inside the sample being measured, or a change of the light intensity. Therefore, if the shape, size and light intensity of the light spot are not controlled, an accurate second harmonic scanning signal diagram cannot be obtained. The shape and size of the light spot can be adjusted through the incident optical system. Of course, the adjustment includes but is not limited to: monitoring by a monitoring system, adjusting the incident light parameters through the incident light path system: or the sample moves with the carrier platform while the parameters of the light source and the incident light system remain constant; or the carrier platform remains stationary, while the light source makes a translation with the parameters unchanged. Although the light intensity can be controlled by adjusting the power, the power is constant during the scan. The relative moving speed remains constant, which can ensure that during a scanning process, the duration of each scanning measurement points irradiated by the laser is equal. The "same batch" means that the samples are the same, the position of the interface to be tested is the same, and the selection of the test purpose and test means is the same. The measurement of the same batch of the product maintains the consistency of the measurement data, which can ensure the comparability of the measurement data. The parameters that need to remain constant are not completely unchangeable but should remain constant in the "same batch" of measurements.

When receiving a second harmonic signal, it should be noted that the exit signal contains many types of light wave signals, and it is necessary to extract useful information targeted, that is, filtering is required. The signal receiving direction of the exit light needs to be adjusted to be the same as the incident angle. The second harmonic signal can be measured and described as a curve, which can be described by using a formula. The formulas here, including the formulas of the prior art and the formulas improved with technological progress later, and the relevant formulas can be used together. The formulas of the prior art, such as a general formula of the second harmonic mentioned in the summary of the invention, will not be repeated to avoid redundant description.

The variation curve of the second harmonic signal contains abundant information. When a device is in a fixed-point measurement mode, the curve of the recorded second harmonic signal changes over time, so it has time-varying characteristics. When the device is in a scanning measurement mode, because a scanning process is subject to limitation, that is, "the shape and size of the spot remain constant; the power of the light source remains constant, that is, when the shape and size of the spot remain constant, the light intensity of the light spot also remains constant; the relative moving speed of the sample and the light spot remains constant", therefore, the time for each measurement point being irradiated of the scanning measurement is equal, that is to say, the value of each measurement point obtained by scanning measurement is the value of each point after being irradiated for the same time, so the value is not a function of time. However, the position of each measurement point in a scanning measurement is all different, so the value changes with a spatial position and has the characteristics of spatial distribution. What needs to be added is that during a fixed-point measurement, during a process from a specified measurement point A to a specified measurement point B, although v>0, no measurement is performed at this time, so there is no such change curve of the second harmonic signal.

FIG. 1 describes the changes in an internal charge distribution of an ideal uniform sample when it is irradiated by a laser in two modes of a fixed-point measurement and a scanning measurement. Wherein, FIG. 1A is a fixed-point measurement mode. It can be seen that since the light intensity in the measurement area presents a Gaussian distribution, the laser-induced internal charge redistribution also presents a Gaussian distribution. Therefore, the distribution of the internal charge is not uniform, and the value of the obtained second harmonic signal also deviates from the theoretical value, which makes it difficult to characterize the state of the sample. FIG. 1B is a scanning measurement mode. The laser-induced internal charge redistribution is uniform in a direction of wafer movement, although the intensity of the spot still remains Gaussian. This is because in this direction, the total time being irradiated at all the measuring points is the same as the total number of photons injected. Therefore, the "Second Harmonic Signal-Coordinates" graph made in a scanning mode can be used as a characterization of the uniformity of the sample in the whole area. This characterization is based on the aforementioned formula and is defined by it. Furthermore, the scanning measurement mode has unique applications in distinguishing the position, size of defects, and relative defect density distribution, which will be involved in subsequent embodiments, and which are not achieved by the fixed-point measurement mode.

In some embodiments, the present invention provides a method for measuring a semiconductor multilayer structure based on second harmonic: the relative movement of the sample and the light spot on the plane has a degree of freedom in X direction.

Figure 5:
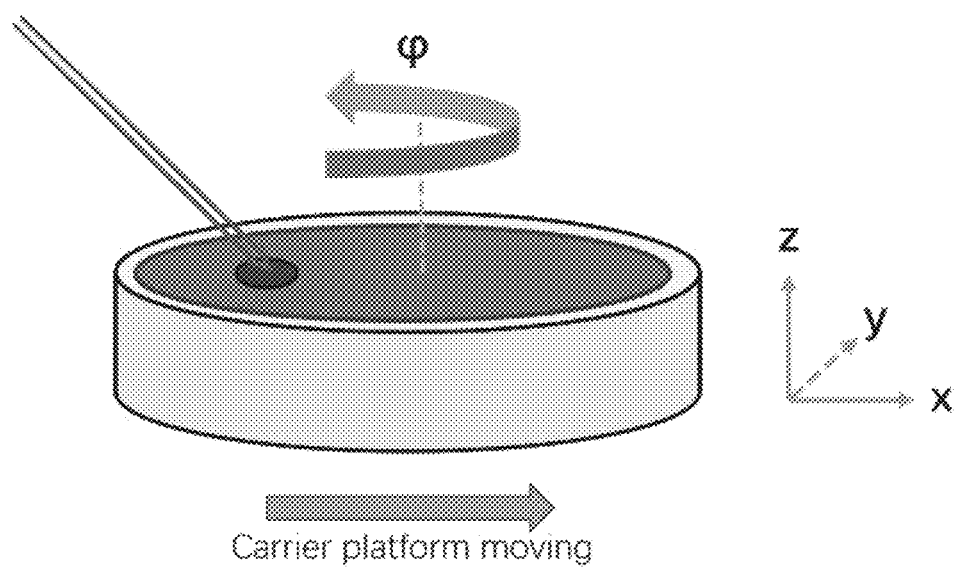
FIG. 5 is a schematic diagram of the freedom degree of the sample carrier platform of a specific embodiment of the present invention: a measurement device for quality monitoring of a semiconductor multilayer structure based on second harmonic.

In this embodiment, as shown in FIG. 5, the relative movement of the sample and the light spot on the plane has a degree of freedom in X direction. The X direction refers to a certain direction, that is, the relative movement is carried out along a straight line, which is a one-dimensional movement.

In some embodiments, the present invention provides a method for measuring a semiconductor multilayer structure based on second harmonic: the relative movement has a degree of freedom in Y direction.

In this embodiment, as shown in FIG. 5, the relative movement of the sample and the light spot on the plane still has a degree of freedom in Y direction. The Y direction refers to a direction other than the X direction, that is, the relative movement has two degrees of freedom. The degrees of freedom in the X and Y directions can complete any form of movement on the XY plane to achieve different forms of scanning. Such as a linear scanning, an arcuate scanning, etc., and the scanning can be carried out along any plane curve.

In some embodiments, the present invention provides a method for measuring a semiconductor multilayer structure based on second harmonic: the relative movement also comprises rotation.

In this embodiment, as shown in FIG. 5, the relative movement of the sample and the light spot also comprises rotation, that is, the scanning measurement can be carried out along a circular motion around a designated point. The specified point can be any point on the plane.

In some embodiments, the present invention provides a method for measuring a semiconductor multilayer structure based on second harmonic: the relative movement is linear.

In this embodiment, the relative movement is linear, such as grating scanning (grating), grid scanning (griding). The direction of the linear movement may be the same as or different from the X direction or the Y direction.

In some embodiments, the present invention provides a method for measuring a semiconductor multilayer structure based on second harmonic: the relative movement is arcuate.

In this embodiment, the relative movement is arcuate, as measured in the course of a parallel rotation.

In some embodiments, the present invention provides a method for measuring a semiconductor multilayer structure based on second harmonic: an azimuth angle of the sample can be adjusted within a range of [0°, 360°] by rotating the sample.

Figure 6:
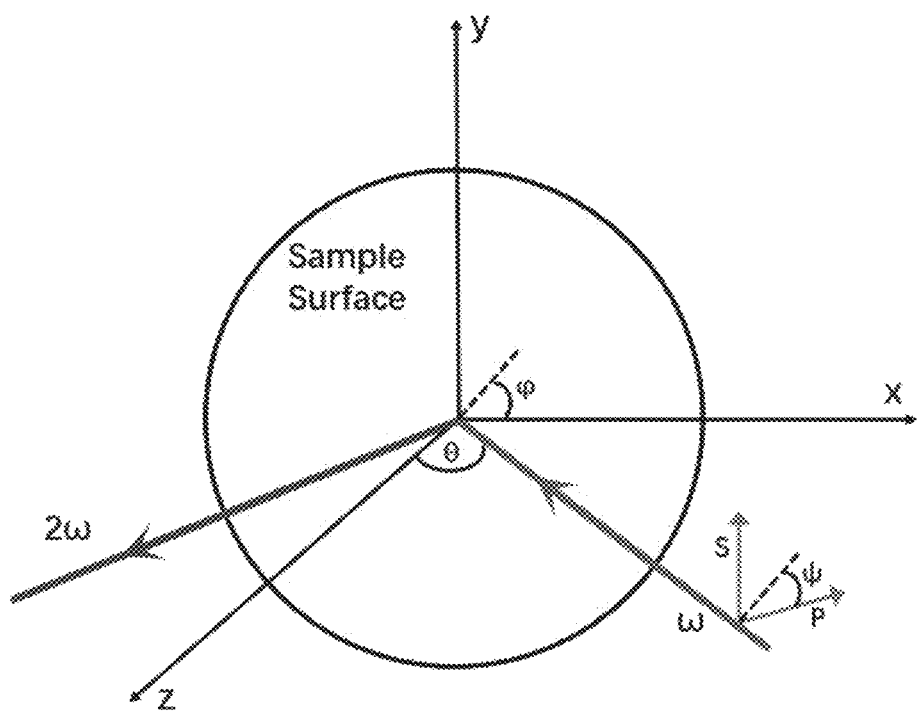
FIG. 6 is a schematic diagram of the optical path angle of a specific embodiment of the present invention: a measurement device for quality monitoring of a semiconductor multilayer structure based on second harmonic.

In this embodiment, the azimuth angle of the sample is adjusted by rotating, that is, an angle between an incident surface and a wafer orientation of the sample, as shown with $\varphi$ in FIG. 6, and then the P or S component of the second harmonic can be separated and analyzed. The adjustment range of the azimuth angle can be selected according to actual needs, and the preferred range recommended in this embodiment is [0°, 360°].

In some embodiments, the present invention provides a method for measuring a semiconductor multilayer structure based on second harmonic: a relative position of the sample and the spot can be adjusted in Z direction.

In this embodiment, a relative position of the sample and the light spot can be adjusted in Z direction (that is in a height direction). Preferably, a precision can reach micron level, even 0.1 micron or even higher precision. During a scanning process, if the height of the sample changes, the light intensity density will change. Therefore, it is possible to control the light intensity by adjusting the sample height in real time. This is mainly based on a purpose of remaining the spot area and light intensity density (such as $I(r,\theta)$ in Formula 1) constant. This is because the unevenness of the surface of the sample itself and the unevenness of the level of the carrier platform cause differences in the height of the measurement points, which lead to changes in the optical path, spot area, and light intensity of the laser, etc. In a scanning mode, it provides a function of real-time height adjustment, which can achieve better scanning measurement effect.

In some embodiments, the present invention provides a method for measuring a semiconductor multilayer structure based on second harmonic: the power of the laser emitted by the light source can be adjusted.

In this embodiment, the power of the laser emitted by the light source is adjustable. The adjustment of the power can control the total number of photons reaching the measurement area per unit time. The greater the power, the more stable the generated signal will be, but at the same time, the number of incident photons per unit time will increase, and the impact on the sample will increase during the measurement. Although the value of the power remains constant in the same batch of measurements to ensure that the intensity of the spot remains constant, sometimes it is necessary to change the power. If the purpose of measurement is different, such as the need to detect the second harmonic change under different power of laser irradiation, it is necessary to adjust the power of the light source. Or, if the samples being measured are different, such as the material layer that the light source needs to penetrate is too thick or the absorption coefficient is too large, it is also necessary to adjust the power to ensure that a sufficient number of photons reach the interface to be measured. When the power is low, the change speed of the signal is slower, allowing a more complete view of the redistribution of internal charge when a wafer is irradiated by the laser, but it takes longer to reach signal saturation. When the power is high, the change speed of the signal is faster. Although the information at an initial moment of laser irradiation may be lost, the time required to reach a saturation state is shorter, which can improve detection efficiency; at the same time, the signal is more stable at a high power. At this moment, according to the description in this invention, it is not the case of "the same batch". The power of the laser source can be adjusted to achieve different measurement purposes.

In some embodiments, the present invention provides a method for measuring a semiconductor multilayer structure based on second harmonic: an adjustment range of the power of the laser is [0, 1000 mW].

In this embodiment, preferably, an adjustment range of the power of the laser is [0, 1000 mW].

In some embodiments, the present invention provides a method for measuring a semiconductor multilayer structure based on second harmonic: the incident light path system can adjust the incident angle of the laser.

In this embodiment, the incident light path system can adjust the incident angle of the laser. An impact of the incident angle on the second harmonic is mainly reflected in the P polarization component of the second harmonic. This is because the P component is a sum of the vectors in the incident and vertical directions. Therefore, by adjusting an incident angle, some components in the second-order polarization tensor of the sample being measured can be quantitatively analyzed.

In some embodiments, the present invention provides a method for measuring a semiconductor multilayer structure based on second harmonic: an adjustment range of the incident angle of the laser is [10°, 90°].

In this embodiment, an adjustment range of the incident angle of the laser is [10°, 90°].

In some embodiments, the present invention provides a method for measuring a semiconductor multilayer structure based on second harmonic: the incident optical path system can adjust a polarization direction of the laser to be P polarization or S polarization.

In this embodiment, the incident optical path system can adjust a polarization direction of the incident laser to be P polarization or S polarization.

In some embodiments, the present invention provides a method for measuring a semiconductor multilayer structure based on second harmonic: there are one or more of the signal receiving systems.

In this embodiment, there are one or more of the signal receiving systems. The signal receiving system may use multiple detectors to receive the second harmonic signal and/or the incident beam-splitting optical signal processed by the exit system and may be used for different functions.

In some embodiments, the present invention provides a method for measuring a semiconductor multilayer structure based on second harmonic: there are two of the signal receiving systems, a P signal receiving system and an S signal receiving system. The P signal receiving system only receives the second harmonic signal in P polarization direction. The S signal receiving system only receives the second harmonic signal in S polarization direction.

In this embodiment, there are two of the signal receiving systems, a P signal receiving system and an S signal receiving system, which are respectively used to receive second harmonic signals in P polarization direction and S polarization direction. It is a selective reception to the second harmonic signal.

In some embodiments, the present invention provides a method for measuring a semiconductor multilayer structure based on second harmonic: when the azimuth angle is zero degree and the polarization direction of the incident optical path system is P, the non-zero signal received by the S signal receiving system is used to denoise of the second harmonic signal received by the P signal receiving system.

In this embodiment, in the case of zero azimuth, when a polarization direction of the incident light path is P, theoretically no second harmonic in S direction will be generated. However, in the actual measurement, due to the slight deviation of the azimuth angle or the angle of the polarizer, or the influence of other interference factors, the second harmonic signal of the S exit optical path is not zero. Therefore, this signal value can be used for noise reduction processing on the P exit light path. It is worth mentioning that the optical path is not only used for noise reduction, in fact, when adjusting the azimuth angle for measurement, the second harmonic signal in the S direction is also meaningful when analyzing the lattice symmetry or defects of the sample.

In some embodiments, the present invention provides a method for measuring a semiconductor multilayer structure based on second harmonic: there are three of the signal receiving systems: a P signal receiving system, an S signal receiving system and an incident beam splitting optical signal system.

In this embodiment, there are three of the signal receiving systems: a P signal receiving system, an S signal receiving system and an incident beam splitting optical signal system. The incident beam splitting optical signal system is a beam directly introduced from the incident light, not a second harmonic signal obtained after measurement.

In some embodiments, the present invention provides a method for measuring a semiconductor multilayer structure based on second harmonic: when the azimuth angle is zero degree, the non-zero signal received by the S signal receiving system is used to denoise of the second harmonic signal received by the P signal receiving system, and at the same time, monitoring the stability of the incident beam splitting optical signal system in real time is used for noise reduction.

In this embodiment, there are two ways of noise reduction. When the azimuth angle is zero degree, the non-zero signal received by the S signal receiving system is used to denoise the second harmonic signal received by the P signal receiving system, which is the same as the noise reduction method aforementioned. At the same time, monitoring the stability of the incident beam splitting optical signal system in real time is used for noise reduction. The incident beam splitting optical signal system collects a beam of split light before the incident light reaches the sample and it is mainly used to monitor the fluctuation of the laser power reaching the sample surface, cooperating with the camera system to monitor the shape and size of the spot, it can be used to monitor the light intensity of the spot and use it to denoise the second harmonic signal.

In some embodiments, the present invention provides a method for measuring a semiconductor multilayer structure based on second harmonic: the method still comprises changing the state of the internal charge distribution at the measurement point in the sample by a separate excitation.

In this embodiment, the method further comprises changing the initial state of the measurement point in the sample by separate excitation. In some cases, it is necessary to change the initial state of the sample before it is scanned, that is a separate "excitation". The change of the initial state should be uniform and stable, which can be achieved by optical or electrical devices.

In some embodiments, the present invention provides a method for measuring a semiconductor multilayer structure based on second harmonic: the separate excitation is achieved by a pump light source.

In this embodiment, the separate excitation is achieved by another light source, that is, a pump light source. The pump light source excites the electrons inside the sample, so that the electrons gain enough energy to move in the sample, thus achieving a state of electron accumulation at the interface. Therefore, the pump light source is required to have a wide power range and wavelength adjustable function. This technical means is applicable to both scanning and fixed-point measurement and is suitable for both before and during measurement. However, since the pump light source has a small spot, it is directional to excite the point to be measured.

In some embodiments, the present invention provides a method for measuring a semiconductor multilayer structure based on second harmonic: the separate excitation is achieved by a flash lamp.

In this embodiment, the excitation light source is a flash lamp. Compared to a pump light, a flash lamp is full coverage and affects the entire wafer. This technique is applicable to both fixed-point measurement mode and scanning measurement mode and is only applicable before measurement.

In some embodiments, the present invention provides a method for measuring a semiconductor multilayer structure based on second harmonic: the separate excitation is achieved by applying a voltage sufficient to change a built-in electric field of the sample to the sample through a bias voltage device.

In this embodiment, the separate excitation is achieved by applying a voltage that is sufficient to change the internal electric field of the sample to be tested to the sample, that is, by adding a bias voltage device to change an initial state of the sample. The method adopts the application of an electric field sufficient to affect the arrangement of internal charges at both ends of the sample, under which charges accumulate at the interface. The final accumulated charge density is not only related to the applied electric field, but also related to other electrical characteristics of the place (such as interface state density, fixed charge density, etc.). After the charge accumulation reaches a stable level, the internal charge distribution of the sample being tested can be effectively detected by a scanning mode, so as to evaluate the electrical characteristics of the entire scanning area. The electric field can be added directly by a DC voltage device, an AC voltage device, etc., or can be added by a magnetic field bias device, a corona device, etc.

A DC voltage device takes advantage of the fact that charges of different polarities respond differently to an electric field. Under the action of DC voltage, movable charges (such as charge carriers, movable ions, etc.) move in a direction of electric field lines and finally accumulate on the interface/surface. In this process, due to the existence of interface state defects or other electrical defects inside the sample, differences in the final accumulation state of the charge are caused, which can be analyzed through the signal feedback of the second harmonic scanning mode. The device can be used before or during the measurement of the second harmonic.

An AC voltage device takes advantage of the fact that different types of charges respond differently to AC voltage. For example, movable charges move periodically with AC voltage (but different types of movable charges move at different speeds or displacements), but fixed charges do not move with it. Even the same type of defect responds differently to voltages of different frequencies. For example, the interface state exhibits low-resistance properties under high-frequency voltages, but high-resistance properties under low-frequency voltages. Therefore, by applying an AC voltage, various electrical characteristics inside the sample can be analyzed in more detail. To ensure the measurement accuracy, the frequency of the AC voltage device is required to be much lower than the signal receiving frequency of the system.

Both of the above two devices, the sample can be placed on a conductive tray (the electrical resistivity is required to be as small as possible), and the tray is grounded; the other end of the sample introduces DC or AC voltage through a non-contact probe or a covered but non-contact conductor plate. In particular, if a conductor plate is used to apply voltage, there should be small holes for light to pass through.

A magnetic field bias device, the sample is placed in a changing magnetic field, a magnetic field induces an electric field, under the action of the electric field, the charge moves inside the sample, so that the sample reaches a state of charge accumulation at the interface. Wherein, the intensity of the applied magnetic field and the induced electric field are described by Maxwell's equation.

A corona device, through a corona device with a high voltage, ionizes the water molecules and carbon dioxide molecules in the surrounding air to produce positive $H_3O_2^+$ ions and negative $CO_3^-$ ions. One type of the ions can be sprayed on the surface of the sample in a targeted manner as needed. In this way, the surface potential of the sample will be changed, and the internal charge of the sample will be attracted or repelled to achieve a purpose of internal charge redistribution.

The various excitation devices in this embodiment may be used in combination with each other or in conjunction with the above-mentioned pump light source or flash lamp. As long as these excitation devices can work independently and do not interfere with each other, it is sufficient.

In many of the solutions described above, the scanning mode itself is independent of the "excitation" device. In an actual measurement process, either the scanning mode can be used alone, or the two can be combined for more forms of measurement. But generally speaking, it takes advantage of the feature that the scanning measurement can characterize an initial interface state of the sample. Meanwhile, the most prominent advantage of the scanning method over a single-point measurement is the increase of measurement points and an improvement of measurement efficiency and accuracy.

In some embodiments, the present invention provides a method for measuring a semiconductor multilayer structure based on second harmonic:
the time-varying characteristics and the space-varying characteristics satisfy simultaneously or respectively:
the time-varying characteristics comprising:
an initial state, characterizing a state of the sample prior to injection of the photons;
a final state, characterizing a state of the sample at the end of the measurement;
a time-varying state, characterizing a dynamic process of an internal charge redistribution of the sample during the injection of the photons;

the space-varying characteristics comprising:
a normal point, that is, the measurement point where a value of the second harmonic signal is within a range of 5% above and below an average value;
an abnormal point, that is, the measurement point where a value of the second harmonic signal is outside a range of 5% above and below the average value.

In this embodiment, the time-varying feature and the space-varying feature may be available at the same time, but not necessarily. Because a fixed-point measurement mode with the time-varying feature and a scanning measurement mode with the space-varying feature can be used successively, at the same time (using the same type of equipment to make the same measurement on the same sample) or can be used separately.

The time-varying feature comprises the initial state, the final state and the time-varying state. The initial state is the initial state of the sample before measurement. The initial state may be the original state of the sample, or a state of the sample after being separately excited. In short, it is a state before measurement. The final state is the state of the sample reached at the end of the measurement. At the end of the measurement, the sample is no longer irradiated, but the state may still continue to change, however, because the device no longer receives new second harmonic signals from it, therefore, for measurement results, only the state at the end can be taken as the final state. Of course, if the measurement time is long enough, it is also possible that the state of the sample has no longer changed at the end of the measurement and has reached a stable state. The time-varying state is a dynamic change process of the sample from the initial state to the final state.

The space-varying feature comprises the normal point and the abnormal point. The value of the second harmonic signal of the normal point is within a range of 5% above and below the average value, that is, in the vicinity of an average value. The value of the second harmonic signal of the abnormal point is outside a range of 5% above and below the average value, that is, it obviously deviates from an average value. The value of 5% is a preferred value provided in this embodiment, and it is also allowed to take other values according to actual conditions.

Figure 7:
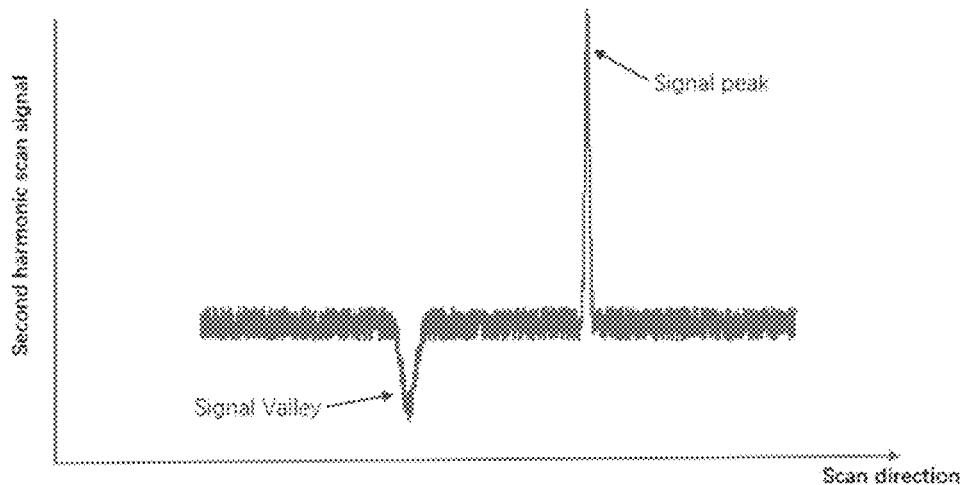
FIG. 7 is a scanning signal diagram of a specific embodiment of the present invention: a measuring method for quality control of a semiconductor multilayer structure based on second harmonic.

FIG. 3 and FIG. 7 are an example of this fixed-point measurement mode combined with the scanning measurement mode. Wherein, FIG. 3 shows the fixed-point measurement of some points, and FIG. 7 shows the scanning measurement mode. A fixed-point measurement can be used for a quantitative analysis of defect density being measured, and a scanning mode can be used for a relative measurement of different measuring points. Therefore, by combining the two measurement modes, it can achieve a quantitative analysis of the defect density in the whole area of the sample. FIG. 7 shows an example of the data in a linear scan case. In an actual measurement, different scanning methods can be adopted for different sample types, so the corresponding data processing methods need to be adopted. For example, for a patterned wafer, because an area to be measured is very small (usually only several times the size of the light spot), then the scanning area can be set to be slightly larger than the test piece (a general area is 50 microns×50 microns) when selecting the scanning mode, and the signal points outside the test piece area can be deleted during data processing; for an unpatterned wafer, various measurement methods can be adopted to achieve randomness and diversity of measured points.

In some embodiments, the present invention provides a method for measuring a semiconductor multilayer structure based on second harmonic: the method also comprises a fixed-scanning correspondence, the fixed-scanning correspondence is a corresponding relationship between the fixed-point measurement mode and the scanning measurement mode, that is: when an average value of the second harmonic signal obtained in the scanning measurement mode is the same as an value at the $t_s$ moment of the second harmonic signal obtained in the fixed-point measurement mode, it is considered that the duration for any measurement point to be irradiated by the laser in the scanning measurement mode is the value of $t_s$, expressed as a formula of $$t_s = \frac{D_s}{v},$$

$t_s$ is the duration of the laser irradiation of the specified measuring point on the sample under the fixed-point measurement mode, $D_s/v$ is the duration of the laser irradiation of the scanning measuring point on the sample under the scanning measurement mode, $D_s$ is the equivalent size of the spot, $D_s>0$, v is the relative moving velocity.

In this embodiment, the corresponding relationship between the fixed-point measurement mode and the scanning measurement mode is established. It is therefore possible to characterize the electrical properties at the interface of the sample being measured by using the scanning measurement mode combined with the fixed-point measurement mode. The advantage of this measurement method is that it is not only the accurate initial state measured by the scanning mode can be used to denoise the data result of the fixed-point measurement, but also the data of the scanning mode can be reprocessed by the result of the fixed-point measurement mode.

$D_s/v$ is the duration of laser irradiation of the measuring point on the sample after the scanning under the scanning measurement mode. Since both of the equivalent size $D_s$ and the relative moving velocity v remain constant, then the value is a fixed value, that is, corresponding to a specific moment $t_s$ in the fixed-point measurement mode, which needs to be confirmed by calculation or comparison of measurement results. When $D_s/v$ is large, it means $t_s$ is large, at this moment the time of the measuring point being irradiated by the laser in the scanning measurement process is a long time; When $t_s$ is large enough, such as more than 10 s, a final state of the fixed-point measurement mode was achieved by the scanning measurement mode. Generally speaking, for the scanning measurement mode to obtain the final state, the relative moving speed needs to be very slow and is related to the total time of a fixed-point measurement, that is, related to the final state of a fixed-point measurement. When $D_s/v$ is very small, that means $t_s$ is very small, the time of the measuring point being irradiated by the laser in the scanning measurement process is very short; When $t_s$ is small enough, an initial value of the fixed-point measurement mode is achieved by the scan measurement mode.

In some embodiments, the present invention provides a method for measuring a semiconductor multilayer structure based on second harmonic: when the speed of the relative movement is $$v \geq \frac{D_s}{T},$$

the average value of the second harmonic signal in the scanning measurement mode corresponds to an value of an initial state in the fixed-point measurement mode, that is, an initial value, and T is an interval time for the signal receiver to collect signals, $D_s$ is an equivalent size of the light spot, and v is the relative moving speed.

In this embodiment, when the speed of the relative movement is $$v \geq \frac{D_s}{T},$$

the total duration of each scanning measurement point being irradiated does not exceed one counting cycle, and this duration is short enough (often in a range of [0.1 ms, 1 ms]), so the internal charge distribution of the scanning measurement point of the sample will not change yet, and the average value of the second harmonic signal in the scanning measurement mode can be used to characterize an initial state of the sample. This point is also a first measurement point (initial value) in the fixed-point measurement mode. In the fixed-point measurement mode, due to a delay between a complete laser irradiation time and a signal collection time (generally in a range of [15 ms, 30 ms]), the interior of the wafer has changed at the moment corresponding to the initial value of the fixed-point measurement. Therefore, the scanning measurement mode can greatly improve an accuracy of the initial value.

Further, during a fast-scanning measurement, the laser irradiates each scanning point for a very short period, so the internal charge distribution of the wafer is not affected. Therefore, the scanning process can repeat along the same scanning path, and then averaging each time measurement results can greatly reduce the noise of scattered particles. In other words, the value obtained from the scanning measurement mode can also be used for noise reduction and correction of the initial value in the fixed-point measurement mode.

In some embodiments, the present invention provides a method for measuring a semiconductor multilayer structure based on second harmonic:

the second harmonic signal formula can be described as Formula 1:

$$\sqrt{SH(2\omega)} = \oiint_0^{D_s/2} \int_{-L_D}^{0} (r,\theta)[\chi^{(2)}\delta(z) + \chi^{(3)}E_{dc}(r,t)] \, r \, dz \, dr \, d\theta$$

In Formula 1, $\chi^{(2)}$, $\chi^{(3)}$, respectively, are a second and third order polarization constants of the sample being tested; $D_s$ is the equivalent size of the light spot; $L_D$ is Debye length; $(r,\theta)$ is a polar coordinate position with the center of the light spot as the origin; z is a distance of the light spot from the interface to be measured in a vertical direction; t is a duration of the measuring point being irradiated by the laser.

In Formula 1, $I(r,\theta)$ is Gaussian light intensity distribution of a spot, which can be described by formula 2 as below:

$$I(r, \theta) = \frac{2P}{\pi w^2} \exp\left(-\frac{2r^2}{w^2}\right) \quad \text{(Formula 2)}$$

P in Formula 2 is a peak power of the laser and w is a beam waist width.

$E_{dc}(r,t)$ in Formula 1 is a built-in electric field at the interface to be measured, which can be described by Formula 3 as below:

$$E_{dc} = -\frac{\sqrt{2}kT_e}{qL_D} \exp\left(-\frac{q(V_g - V_{FB})}{2kT_e}\right) + \frac{qN\alpha^{-1}}{\varepsilon_s \varepsilon_0} \quad \text{(Formula 3)}$$

In Formula 3, q is an electron charge constant, k is an Boltzmann constant, $T_e$ is an ambient temperature, $V_g$ is an external bias voltage applied by the bias voltage device, $V_{FB}$ is a flat band voltage, N is a volume charge density, $\alpha^{-1}$ is a penetration depth of the second harmonic signal in the semiconductor layer, $\varepsilon_s$ is a dielectric constant of the semiconductor layer, $\varepsilon_0$ is a vacuum dielectric constant.

In this embodiment, as shown in FIG. 1, it is an ideal and uniform internal charge distribution change of the sample when it is irradiated by laser in two modes of a fixed-point measurement and a scanning measurement. Wherein, FIG. A is the fixed-point measurement mode. It can be seen that since the light intensity in the measurement area presents a Gaussian distribution, the laser-induced internal charge redistribution also presents a Gaussian distribution. Therefore, data processing can no longer be analyzed by the formulas published in the existing literature, but should be analyzed by Formula 1, Formula 2 and Formula 3. Formula 1 is a further generalization of the general formula for the second harmonic $I_{2\omega} = |\chi^{(2)} + \chi^{(3)} e^{i\varphi} E_{dc}(t)|^2 I_\omega^2$. Wherein, $\chi^{(2)}$ and $\chi^{(3)}$ are a second/third order polarization tensor of the sample, respectively, $I_\omega$ is the light intensity at the measurement point, $E_{dc}(t)$ is the built-in electric field at the interface, and $\varphi$ is the phase difference of the two terms. As mentioned above, because the light intensity is no longer uniformly distributed, and the electric field intensity changes in the measurement area are also different, this embodiment proposes a new formula, that is, Formula 1. In Formula 1, the built-in electric field is the most important parameter, and it is the most fundamental cause of the time-varying second harmonic signal.

Formula 2 is an existing formula of intensity distribution of Gaussian spot. However, in the existing second harmonic technology, the light intensity distribution is always calculated as a uniform light spot, which brings errors in an actual measurement. Therefore, the present invention introduces the existing formula to establish a more accurate physical model.

The electric field formula of Formula 3 fits for the scanning measurement mode better. Because the distribution of incident photons in the scanning process is uniform, so is the charge accumulation, which is consistent with the theoretical model in Formula 3. Here, two values that need special attention, $V_g$ is the voltage applied through the voltage bias device, which is sufficient to change the initial state of the sample under test; and N is the accumulated charge density at the interface in the measurement process, which is the change of charge distribution at the interface caused by the capture of electrons by interface states or fixed charges during the movement process. Formula 3 is a further extension of the second harmonic formula of the invention and a more accurate description of the built-in electric field at the semiconductor interface. In the existing second harmonic technology, it is believed that the change of the built-in electric field comes from the charge accumulation at the interface, but in fact, the built-in electric field should be the result of various electrical defects and charge accumulation. Whereas the effect of electrical defects can be described by the flat-band voltage (i.e., the first item on the right of Formula 3), which can be adjusted by the external voltage; the effect of charge accumulation can be described by the second term on the right of Formula 3. Therefore, it can be seen that the model described by Formula 3 is closer to a real situation, so it can better describe the fixed-point measurement model.

The purpose of the combination of the scanning measurement mode and the bias voltage technique is to change the initial built-in electric field of the sample being tested, that is, $E_{dc}$ in Formula 3. The advantages brought by this combination to the measurement are: 1) it can improve the signal-to-noise ratio of the signal; 2) it can make the measured sample in different working states (majority carrier accumulation state, majority carrier depletion state, minority carrier accumulation state, inversion), so as to make a more accurate analysis to the property of the sample; 3) by adding different bias voltages, measure the movable charge (such as $Na^+$) in the oxide layer: when $V_g$ is positive, the movable charge moves to the interface; when $V_g$ is negative, the movable charges move toward the surface.

Formula 1, formula 2 and formula 3 provided by the invention are used for calculation, so that the actual measurement results and theoretical model are unified under the three modes of a fixed-point measurement, a scanning measurement, and the combination of a fixed-point measurement and a scanning measurement, so that the second harmonic measurement technology is no longer only a qualitative analysis method, but can be applied as a quantitative analysis method.

In some embodiments, the present invention provides a method for measuring a semiconductor multilayer structure based on second harmonic, the method further comprising:
after measurement in the scanning mode, the scanning direction is taken as an abscissa, and the value of the second harmonic signal is taken as an ordinate to do a scanning signal diagram;
in the scanning signal diagram, signal peaks and signal valleys are abnormal points of data;
the defect density at the abscissa of the peak value corresponding to the signal peak is larger than that of the surrounding area, the abscissa of the peak value is a defect center, a width of the signal peak is a size width of the defect at this place, and a height of the signal peak is used to characterize a defect density;
the defect density at the abscissa of the valley value corresponding to the signal valley is smaller than that of the surrounding area, the abscissa of the valley value is a defect center, a width of the signal valley is a size width of the defect at this place, and a height of the signal valley is used to characterize a defect density.

In this embodiment, as shown in FIG. 7, the abscissa is the coordinate of scanning direction, and the ordinate is the second harmonic signal obtained by scanning. Since the second harmonic signal is related to the defect density, the defect density at the abscissa of the peak value corresponding to the signal peak in the diagram is larger than that around it, the abscissa of the peak value is the defect center, the width of the signal peak is the size width of the defect at this place, and the height of the signal peak is used to characterize the defect density; the defect density at the abscissa of the valley value corresponding to the signal valley is smaller than the surrounding area, the abscissa of valley value is the defect center, the width of signal valley is the size width of the defect at this place, and the height of signal valley is used to characterize the defect density. Therefore, the relative defect distribution of the sample can be measured by scanning mode.

In some embodiments, the present invention provides a method for measuring a semiconductor multilayer structure based on second harmonic, the method further comprising:
a defect density distribution diagram is made according to a value of the second harmonic signal and a scanning measuring point coordinate position of the scanning measurement mode;
in the defect density distribution diagram, a bright spot corresponds to the signal peak in the scanning signal diagram, indicating that the defect density of the coordinate position of the scanning measuring point corresponding to the bright spot is larger than the surrounding area. A dark spot corresponds to the signal valley in the scanning signal diagram, indicating that the defect density of the coordinate position of the scanning measuring point corresponding to the dark spot is smaller than the surrounding area.

Figure 8:
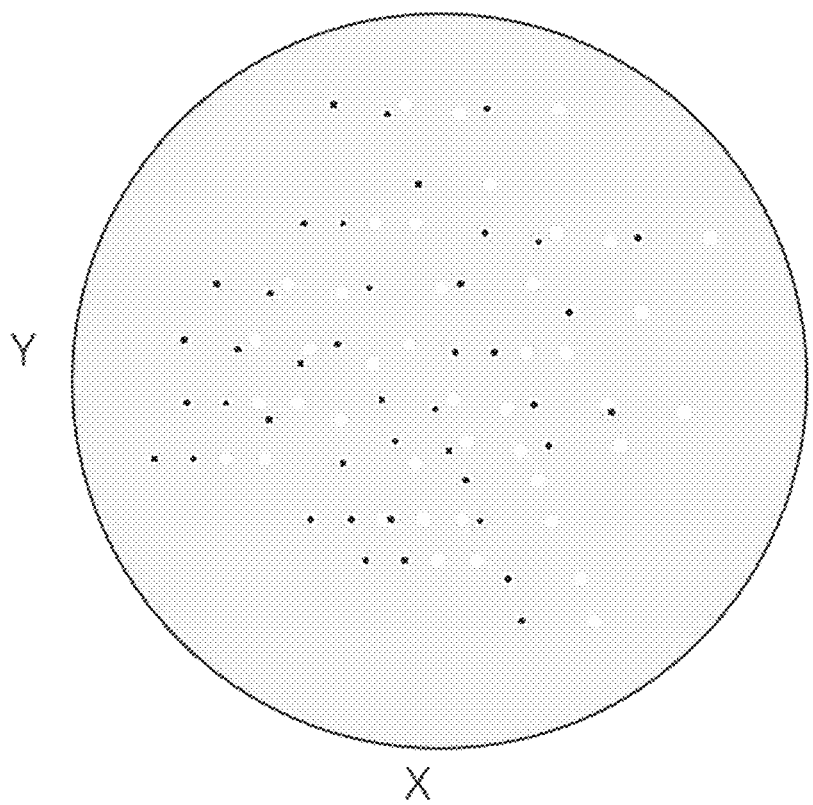
FIG. 8 is a defect density distribution diagram of a specific embodiment of the present invention: a measuring method for quality control of a semiconductor multilayer structure based on second harmonic.

In this embodiment, as shown in FIG. 8, it is a defect density distribution diagram after the scanning measurement mode. Wherein, the defect density at the bright spot is larger than the surrounding area, corresponding to the peak in FIG. 7; the defect density at the dark spot is smaller than the surrounding area, corresponding to the valley in FIG. 7.

In some embodiments, the present invention provides a method for measuring a semiconductor multilayer structure based on second harmonic, the method still comprising:
in the fixed-point measurement mode, a measurement time is taken as an abscissa, and a value of the second harmonic signal as an ordinate to make a time-varying second harmonic signal diagram.

The time-varying second harmonic signal diagram has the following characteristics:
the initial state point is the first point in the time-varying second harmonic signal diagram, which characterizes a state of the sample before injecting the photons;
the final state point is the last point in the time-varying second harmonic signal diagram, which characterizes a state of the sample at the end of the measurement;
the time-varying state point is a point between the initial state point and the final state point in the time-varying second harmonic signal diagram, which characterizes a dynamic process of the internal charge redistribution of the sample during the photon injection process.

In this embodiment, it involves three most concerned aspects in an entire time-varying second harmonic curve: an initial state, a final state, and a time-varying state.

An initial state point characterizes a state of the sample before it is injected with photons, that is, the first point in FIGS. 3A, 3B, 3C and 3D. At this time, no free electrons have been excited into the oxide layer, and the built-in electric field at this time is an initial built-in electric field.

A time-varying state point characterizes a dynamic process of charge redistribution in the sample after photon injection, reflecting the process of electron capture by interface state or bulk charge. This is reflected in the changing line segment in the middle in FIGS. 3A, 3B, 3C and 3D. During this process, the built-in electric field changes, producing a time-varying second harmonic signal. The rate of signal change is related to the thickness of the oxide layer, the band gap width of the material and the frequency of the incident photon, etc. Taking silicon as an example, Formula 4 can be used to calculate the growth rate of the second harmonic curve when the interface charge density is σ.

$$\frac{1}{\tau_g(\sigma)} = \frac{1}{\tau_g(0)}\left[1 - \frac{e^2 \sigma D_{\textit{eff}}}{\varepsilon_{Si}(n\hbar w - \phi_{ox})}\right] \quad \text{(Formula 4)}$$

Wherein, $\varepsilon_{Si}$ is a dielectric constant of silicon, n is the number of photons absorbed by the electron energy level transition, h is a reduced Planck constant, ω is an angular frequency of light, $\emptyset_{ox}$ is a band gap width of the oxide layer, e is an electron charge constant, σ is an interface charge surface density, $D_{eff}$ is an oxide layer thickness. It can be seen from Formula 4 that when the oxide layer thickness exceeds a threshold, Formula 4 approaches 0, and the second harmonic signal generated no longer changes over time. Therefore, for a thicker oxide layer, the probability of electronic energy level transition and reaching the surface of the oxide layer can be increased by increasing the frequency of incident photons.

A final state point characterizes a state of the sample after photon injection and reaching stability or a state at the end of measurement time. The so-called stable means that, within the measurement time, the excitation and recombination of new free electrons reach a balance, the internal charge distribution of the sample reaches a dynamic balance, and the built-in electric field does not change anymore. After that, even if the measurement time is extended, the signal value will not change significantly again, which is reflected in the line segment after signal stabilization in FIGS. 3B, 3C and 3D. However, in the case of using a low power excitation light, it is possible that the sample still does not reach a stable state at the end of the measurement, and thereafter if the measurement time is extended, the second harmonic signal will still show a tendency to change over time. In this case, the last point measured can be defined as a final state, as the last point marked in FIG. 3A.

In some embodiments, the present invention provides a method for measuring a semiconductor multilayer structure based on second harmonic, the method further comprising: select some or all of the signal outliers as the specified measurement points and enter the fixed-point measurement mode.

In this embodiment, a special point selection is used for the location of the fixed-point measurement. Special point selection means that during the measurement process, the abnormal point (peak or valley) of the signal will be measured at a fixed-point measurement, and the purpose is to carry out more detailed measurement and analysis on this point.

In some embodiments, the present invention provides a method for measuring a semiconductor multilayer structure based on second harmonic, the method further comprising: randomly select the measurement point as the specified measurement point in advance and enter the fixed-point measurement mode.

In this embodiment, random selection is used for the location of the fixed-point measurement. Random selection is a random selection before measurement and is mainly used for the calculation of defect density.

Figure 9:
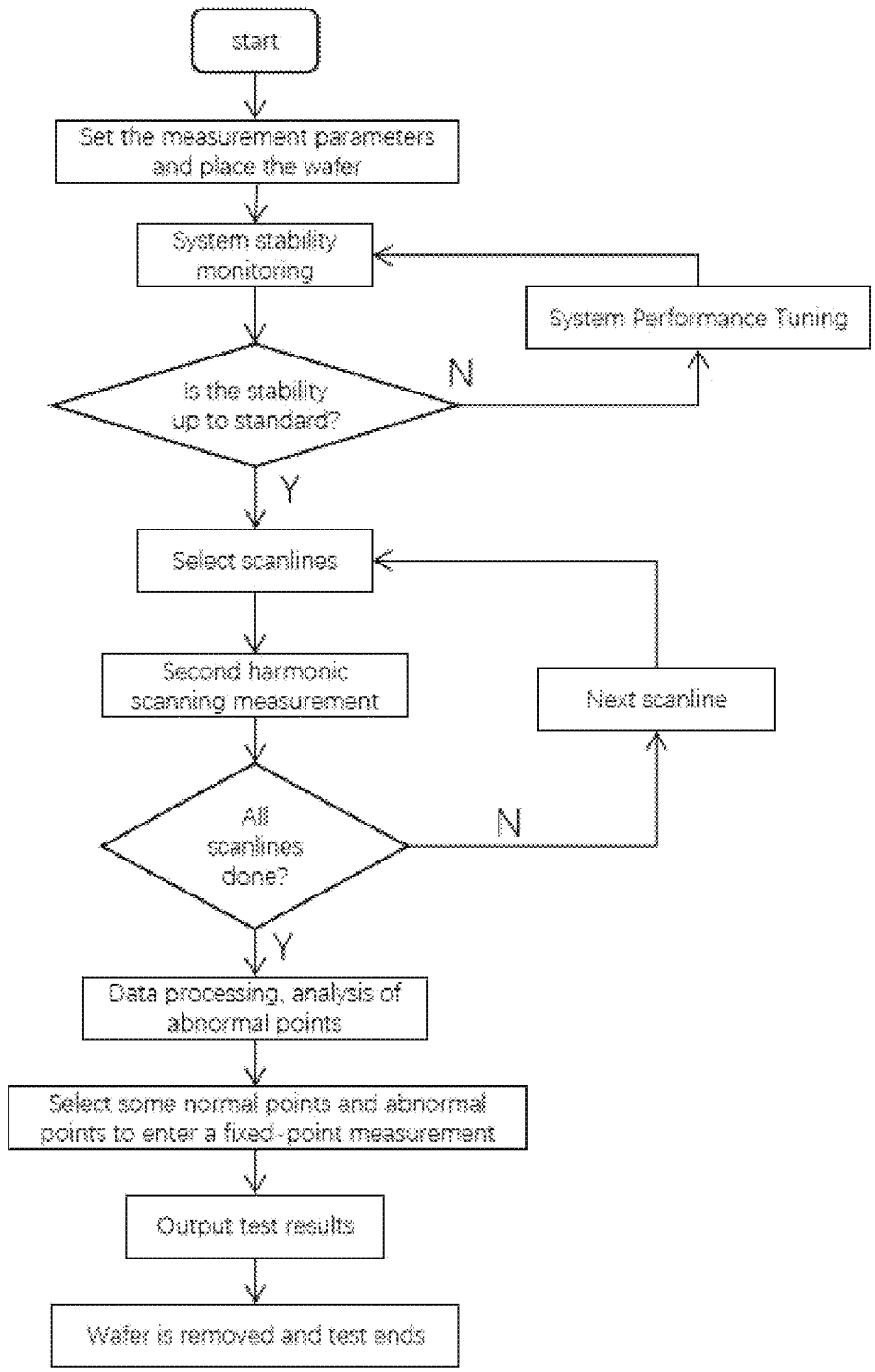
FIG. 9 is a scan-fixed-point test flow chart of the measurement of the present invention: a measuring method for quality control of a semiconductor multilayer structure based on second harmonic.

As shown in FIG. 9, it is a flow chart of a specific measurement process based on the comprehensive use of the techniques provided by the foregoing embodiments. The measurement steps: put in the wafer, adjust the parameters, select the scanning line, move the carrier platform and measure until all the scanning measurement tasks are completed, analyze the abnormal points, and enter the fixed-point measurement mode. After all measurements are completed, data analysis is performed.

In the second aspect, an embodiment of the present invention proposes a device for measuring a semiconductor multilayer structure based on second harmonic, the device comprising:

a light source emits a laser, passes through an incident optical path system, forms a light spot on a sample, and injects photons into the sample, that is, carries out a laser irradiation on the sample;

the incident light path system is used to adjust beam parameters of the laser emitted by the light source;

the sample is a detectable structure consisting of more than 2 layers of substance, at least one layer of the substance is a semiconductor layer, the light source can reach an interface to be probed, namely, the interface to be probed;

a carrier platform is used to carry and move the sample on a plane, and a speed of the plane movement is v, v≥0; when the device enters a fixed-point measurement mode, that is, when the specified measurement point is measured, v=0; when the device enters a scanning measurement mode, v>0, the direction of the plane moving is a scanning direction;

an exit optical path system is used to adjust second harmonic parameters of the outgoing second harmonic;

a signal receiving system is used to receive a second harmonic signal adjusted by the exit optical path system, a change curve of the second harmonic signal can be described as a second harmonic signal formula; the change curve of the second harmonic signal, comprising the following information: when entering the fixed-point measurement mode, the time variation characteristics of the second harmonic signal generated by the specified measuring point are recorded; when entering the scanning measurement mode, the spatial distribution characteristics of the second harmonic signal generated by the scanning measuring point in the process of the relative movement are recorded;

a monitoring system is used for real-time monitoring of a running state of the device and sending real-time feedback information;

an input system is used to receive a user's input information in a human-computer interaction;

a display system is used for displaying an output information of the device in a human-computer interaction;

a central processing system is used for receiving the input information and the real-time feedback information, controlling running of the device, processing the second harmonic signal according to the second harmonic signal formula, and outputting the output information;

during a scanning measurement process of a same batch of the sample, a shape and size of the spot remain constant; a power of the light source remains constant, that is, when the shape and size of the light spot remain constant, a light intensity of the light spot also remains constant; the relative moving speed of the sample and the light spot remains constant.

Figure 4:
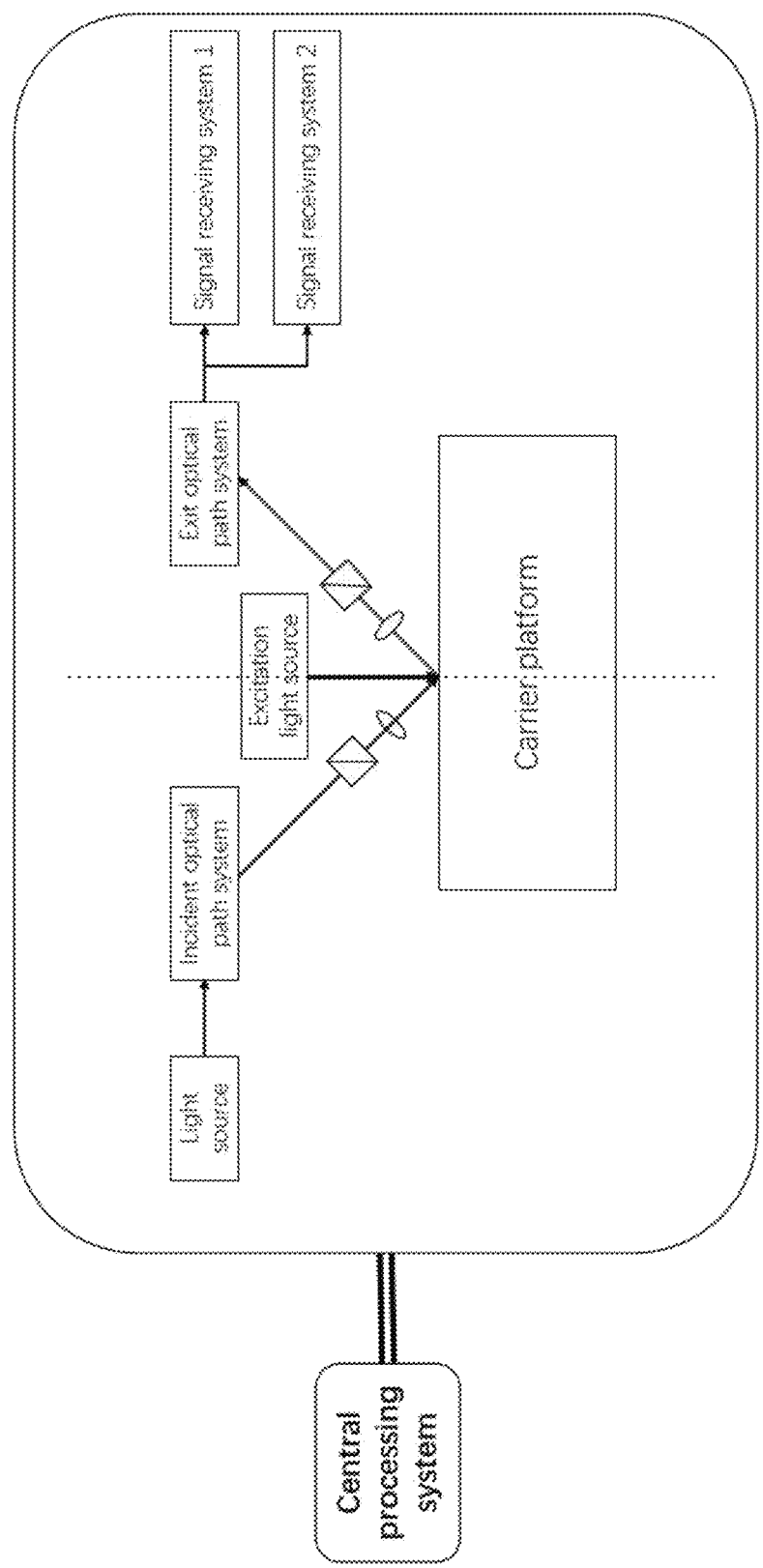
FIG. 4 is a schematic diagram of a partial structure of a specific embodiment of the present invention: a measurement device for quality monitoring of a semiconductor multilayer structure based on second harmonic.

In this embodiment, a device for measuring a semiconductor multilayer structure based on second harmonic is provided, and FIG. 4 shows a partial structure of the device. The device comprises the light source, the incident optical path system, the sample, the carrier platform, the exit optical path system, the signal receiving system, the monitoring system, the input system, the display system and the central processing system. In a general second harmonic measurement technology, both "probing" and "excitation" are carried out simultaneously. This is because the photons of the probing source itself will also cause an energy level transition of electrons. Even if a low-power probing source is selected (which itself will cause a low measurement signal and a large noise), after a long-term irradiation, still cause changes in the internal charge distribution of the sample. A scanning method provided by the present embodiment can effectively achieve "probing" without changing the internal charge distribution of the sample. By controlling the shape, size, light intensity and scanning speed of the light spot, the scanning method provided in the present embodiment endows a scanning measurement with a function of separate "probing", that is, under the circumstance of the internal charge distribution of the sample hardly changing, and the measured signal only relating to the initial state of the measured area, the detection of the sample is achieved. Therefore, the light source is truly a single-purpose light source based on technical means. Of course, in a fixed-point measurement, the light source can also perform probing and excitation at the same time.

A laser passes through an incident optical system to form a light spot on the sample. The area of the light spot will affect the number of incident photons per unit area (light intensity density). Under the same power, the smaller the light spot area, the more concentrated the incident photons, and the greater the impact on the sample during the measurement process, but at the same time, the higher the resolution of the system device.

The sample is a probing structure with an interface consisting of more than two layers of substances, at least one layer of substances is a semiconductor layer. The technical solution of the present embodiment probes an interface state of a semiconductor, therefore, one of the substances being probed must be a semiconductor and must be composed of more than two layers, otherwise the so-called "interface" cannot be formed. The structure of the semiconductor material, comprising common semiconductor materials (such as Si, Ge, SiC, GaN, etc.), new oxide semiconductors (such as ZnO, CdO, $Fe_2O_3$, etc.), one-dimensional semiconductors (such as graphene, black phosphorus, etc.) and other semiconductor materials (such as diamond, etc.). The light source should be able to reach the interface to be probed, which mainly limits the thickness of each layer of the sample being tested (especially a material layer with a large absorption coefficient). If the material layer that the light source needs to penetrate is too thick or the absorption coefficient is too large, so that not enough photons reach the interface to be measured, the probing function cannot be achieved. In the case of patterned samples, the surface area of the test area is also required to be larger than the light spot size.

The carrier platform carries the sample, and the relative movement of the sample and the spot on the plane is achieved through the movement of the carrier platform. When entering a fixed-point measurement mode, the relative moving speed v=0. After one point is measured, the next point can be measured. The light source is turned off while moving to the next measuring point. When entering a scan measurement mode, v>0.

A relative movement of the sample and the light spot on a plane may be that the sample is moving, the light spot is moving, or both are moving. When carrying out a fixed-point measurement mode, the relative movement speed v=0. After one point is measured, the next point can be measured. During the process of moving to the next measurement point, the light source is switched off. When entering a scanning measurement mode, v>0.

The exit optical path system is used to adjust the second harmonic parameters of the exit second harmonic, including but not limited to the polarization direction of the exit light and the exit angle.

The signal receiving system is used to receive the second harmonic signal adjusted by the exit optical path system, and the second harmonic signal can be described as the second harmonic signal formula. When receiving a second harmonic signal, it should be noted that the exit signal contains many types of light wave signals, and it is necessary to extract useful information targeted, that is, filtering is required. The signal receiving direction of the exit light needs to be adjusted to be the same as the incident angle. The second harmonic signal can be measured and described as a curve, which can be described by using a formula. The formulas here, including the formulas of the prior art and the formulas improved with technological progress later, and the relevant formulas can be used together. The formulas of the prior art, such as a general formula of the second harmonic mentioned in the summary of the invention, will not be repeated to avoid redundant description.

The monitoring system is used to monitor the running state of the device in real time and send out real-time feedback information. The running state comprises the power of the light source, the size of the spot, the height of the platform, etc.

The input system is used to receive a user's input information in human-computer interaction. The input system can be directly connected with the body of the device, can also be wireless or wired for data transmission, to ensure that the input information is transmitted to the device.

The display system is used to display the output information of the device in human-computer interaction. The display system can be directly connected with the body of the device, can also be wireless or wired for data transmission, to ensure that the output information from the device can be obtained.

The central processing system is used to receive the input information and the real-time feedback information, control the running of the device, process the second harmonic signal according to the second harmonic signal formula, and output the output information. The central processing system can be integrated with the body of the device, or in the cloud; it can be one computer, or multiple computers; it can be a physical computer, or a virtual machine. Processing the second harmonic signal according to the second harmonic signal formula comprises making the change curve of the second harmonic signal. The variation curve of the second harmonic signal contains abundant information. When a device is in a fixed-point measurement mode, the curve of the recorded second harmonic signal changes over time, so it has time-varying characteristics. When the device is in a scanning measurement mode, because a scanning process is subject to limitation, that is, "the shape and size of the spot remain constant; the power of the light source remains constant, that is, when the shape and size of the spot remain constant, the light intensity of the light spot also remains constant; the relative moving speed of the sample and the light spot remains constant", therefore, the time for each measurement point being irradiated of the scanning measurement is equal, that is to say, the value of each measurement point obtained by scanning measurement is the value of each point after being irradiated for the same time, so the value is not a function of time. However, the position of each measurement point in a scanning measurement is all different, so the value changes with a spatial position and has the characteristics of spatial distribution. What needs to be added is that during a fixed-point measurement, during a process from a specified measurement point A to a specified measurement point B, although v>0, no measurement is performed at this time, so there is no such change curve of the second harmonic signal.

Figure 10:
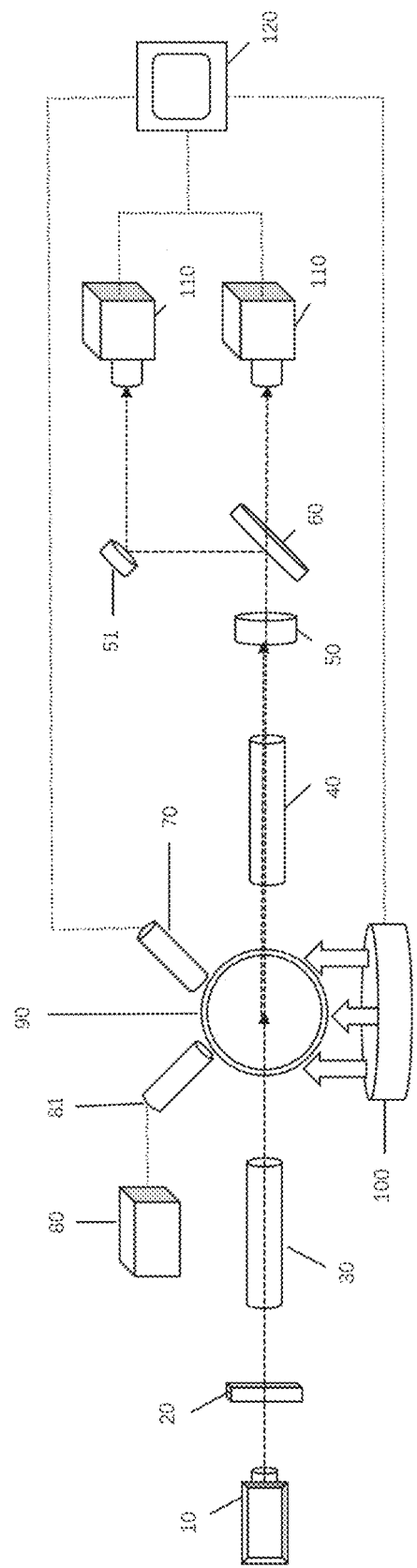
FIG. 10 is a schematic diagram of a partial structure of a specific embodiment of the present invention: a measurement device for quality monitoring of a semiconductor multilayer structure based on second harmonic.

Specifically, as shown in FIG. 10, it is a specific example of the optical path system structure. The incident light is emitted by the laser (10) as the light source, reaches the sample (90) through the polarizer (20) and the collimator lens group (30), excites the second harmonic, and generates reflected light; through the collimator lens group (40), after the filter (50), the reflected light is filtered out, and only the excited second harmonic passes through the beam splitting prism (60) to generate the second harmonic in two polarization directions; wherein the second harmonic in the P direction passes through the beam-splitting prism (60) is directly received by the signal receiver (110), and the second harmonic in the S direction passes through the beam-splitting prism (60) and is reflected by the reflector (51) to be received by another signal receiver (110)). During the measurement process, the information of the measured area is monitored by the transmission electron microscope (80) and the lens group (81, 70), while the height, coordinates, and moving speed of the sample are controlled by the carrier platform (100); all information, including measurement data are finally collected to the central processing system (120) for processing.

FIG. 1 describes the changes in an internal charge distribution of an ideal uniform sample when it is irradiated by a laser in two modes of a fixed-point measurement and a scanning measurement. Wherein, FIG. 1A is a fixed-point measurement mode. It can be seen that since the light intensity in the measurement area presents a Gaussian distribution, the laser-induced internal charge redistribution also presents a Gaussian distribution. Therefore, the distribution of the internal charge is not uniform, and the value of the obtained second harmonic signal also deviates from the theoretical value, which makes it difficult to characterize the state of the sample. FIG. 1B is a scanning measurement mode. The laser-induced internal charge redistribution is uniform in a direction of wafer movement, although the intensity of the spot still remains Gaussian. This is because in this direction, the total time being irradiated at all the measuring points is the same as the total number of photons injected. Therefore, the "Second Harmonic Signal-Coordinates" graph made in a scanning mode can be used as a characterization of the uniformity of the sample in the whole area. This characterization is based on the aforementioned formula and is defined by it. Furthermore, the scanning measurement mode has unique applications in distinguishing the position, size of defects, and relative defect density distribution, which will be involved in subsequent embodiments, and which are not achieved by the fixed-point measurement mode.

In a scanning measurement mode, it is necessary to keep a power of a light source stable. An value of the second harmonic signal is proportional to the square of a light intensity, so in an actual scanning measurement, a stability of the light intensity must be guaranteed (that is, a stability of the power, light spot shape, and size), otherwise the data in a scanning second harmonic signal cannot be known whether the fluctuation is caused by a change of the electrical characteristics inside the sample being measured, or a change of the light intensity. Therefore, if the shape, size and light intensity of the light spot are not controlled, an accurate second harmonic scanning signal diagram cannot be obtained. The shape and size of the light spot can be adjusted through the incident optical system. Of course, the adjustment includes but is not limited to: monitoring by a monitoring system, adjusting the incident light parameters through the incident light path system; or the sample moves with the carrier while the parameters of the light source and the incident light system remain constant. Although the light intensity can be controlled by adjusting the power, the power is constant during the scan. The relative moving speed remains constant, which can ensure that during a scanning process, the duration of each scanning measurement point irradiated by the laser is equal. The "same batch" means that the samples are the same, the position of the interface to be tested is the same, and the selection of the test purpose and test means is the same. The measurement of the same batch of the product maintains the consistency of the measurement data, which can ensure the comparability of the measurement data. The parameters that need to remain constant are not completely unchangeable but should remain constant in the "same batch" of measurements.

In some embodiments, the present invention provides a device for measuring a semiconductor multilayer structure based on second harmonic: the plane movement of the carrier platform has a degree of freedom in X direction.

In this embodiment, as shown in FIG. 5, the plane movement of the carrier platform has freedom in X direction. The X direction refers to a certain direction, that is, the relative motion is along a straight line, which is one-dimensional motion.

In some embodiments, the present invention provides a device for measuring a semiconductor multilayer structure based on second harmonic: the plane movement of the carrier platform has a degree of freedom in Y direction.

In this embodiment, as shown in FIG. 5, the plane movement of the carrier platform also has freedom in Y direction. The Y direction refers to a direction other than the X direction, that is, the relative motion has two degrees of freedom. The degrees of freedom in the X and Y directions can complete any form of motion in the XY plane and achieve different forms of scanning. Such as linear scanning, arcuate scanning, etc., and the scanning can be carried out along any plane curve.

In some embodiments, the present invention provides a device for measuring a semiconductor multilayer structure based on second harmonic: the carrier platform can also rotate.

In this embodiment, as shown in FIG. 5, the plane movement of the carrier platform also comprises rotation, that is, the scanning measurement can be carried out around a specified point along the direction of circular motion. The specified point can be any point on the carrier platform.

In some embodiments, the present invention provides a device for measuring a semiconductor multilayer structure based on second harmonic: a position of the carrier platform in a height direction can be adjusted.

In this embodiment, the carrier platform can adjust the position in the height direction to cooperate with the light source and the shape and size of the light spot controlled by the incident light path system.

In some embodiments, the present invention provides a device for measuring a semiconductor multilayer structure based on second harmonic: in the scanning measurement mode, according to real-time feedback of a height of the measurement point of the sample, the position of the carrier platform is adjusted in real time correspondingly in the height direction.

In this embodiment, the carrier platform adjusts the relative position in the height direction. Preferably, the accuracy can be up to micron level, even 0.1 micron or more accuracy. During a scanning process, if the height of the sample changes, then the light intensity density will change. Therefore, it is possible to control the light intensity by adjusting the sample height in real time. This is mainly based on a purpose of remaining the spot area and light intensity density (such as $I(r,\theta)$ in Formula 1) constant. This is because the unevenness of the surface of the sample itself and the unevenness of the level of the carrier platform cause differences in the height of the measurement points, which lead to changes in the optical path, spot area, and light intensity of the laser. In a scanning mode, it provides a function of real-time height adjustment, which can achieve better scanning measurement effect.

In some embodiments, the present invention provides a device for measuring a semiconductor multilayer structure based on second harmonic: the plane movement is linear.

In this embodiment, the plane movement is linear, such as a grating scanning (grating) and a griding scanning (griding). The direction of the linear movement may be the same as or different from the X direction or the Y direction.

In some embodiments, the present invention provides a device for measuring a semiconductor multilayer structure based on second harmonic: the plane movement is arcuate.

In this embodiment, the plane movement is arcuate, as measured in the course of a parallel rotation.

In some embodiments, the present invention provides a device for measuring a semiconductor multilayer structure based on second harmonic: an azimuth angle of the sample can be adjusted by rotating the carrier platform. Preferably, an adjustment range of the azimuth angle is [0°, 360°].

In this embodiment, the azimuth angle of the sample is adjusted by rotating, that is, an angle between an incident surface and a wafer orientation of the sample, as shown with φ in FIG. 6, and then the P or S component of the second harmonic can be separated and analyzed. The adjustment range of the azimuth angle can be selected according to actual needs, and the preferred range recommended in this embodiment is [0°, 360°].

In some embodiments, the present invention provides a device for measuring a semiconductor multilayer structure based on second harmonic: the device can make the duration of the measuring point of the sample irradiated by the laser in a range of [0.1 ms, 1 ms] by adjusting the scanning size of the light spot and the moving speed of the carrier platform.

In this embodiment, by controlling the moving speed, the total length of irradiation of each measuring point is within a range of [0.1 ms,1 ms] and generally does not exceed one counting cycle, which is short enough, so the internal charge distribution of the wafer at the measured point does not change yet and can be used to characterize the initial state of the wafer. For a fixed-point measurement, since there is a delay between the complete laser irradiation time and the signal collection time (generally within a range of [15 ms, 30 ms]), at the moment corresponding to the initial value of a fixed-point measurement, the inside of the wafer has changed. Therefore, the technical solution provided by the embodiment can greatly improve the accuracy of the initial value and can be used to reduce noise and correct the fixed-point measurement results.

In some embodiments, the present invention provides a device for measuring a semiconductor multilayer structure based on second harmonic: a power of the light source can be adjusted.

In this embodiment, the power of the laser emitted by the light source is adjustable. The adjustment of the power can control the total number of photons reaching the measurement area per unit time. The greater the power, the more stable the generated signal will be, but at the same time, the number of incident photons per unit time will increase, and the impact on the sample will increase during the measurement. Although the value of the power remains constant in the same batch of measurements to ensure that the intensity of the spot remains constant, but sometimes it is necessary to change the power. If the purpose of measurement is different, such as the need to detect the second harmonic change under different power of laser irradiation, it is necessary to adjust the power of the light source. Or, if the samples being measured are different, such as the material layer that the light source needs to penetrate is too thick or the absorption coefficient is too large, it is also necessary to adjust the power to ensure that a sufficient number of photons reach the interface to be measured. When the power is low, the change speed of the signal is slower, allowing a more complete view of the redistribution of internal charge when a wafer is irradiated by the laser, but it takes longer to reach signal saturation. When the power is high, the change speed of the signal is faster. Although the information at an initial moment of laser irradiation may be lost, the time required to reach a saturation state is shorter, which can improve detection efficiency; at the same time, the signal is more stable at a high power. At this moment, according to the description in this invention, it is not the case of "the same batch". The power of the laser source can be adjusted to achieve different measurement purposes.

In some embodiments, the present invention provides a device for measuring a semiconductor multilayer structure based on second harmonic: a power range of the light source is [0, 1000 mW].

In this embodiment, preferably, the power adjustment range of the light source is [0, 1000 mW].

In some embodiments, the present invention provides a device for measuring a semiconductor multilayer structure based on second harmonic: the light beam parameters that can be adjusted by the incident light path system comprising: an incident angle and/or an incident light polarization direction.

In this embodiment, the beam parameters that can be adjusted by the incident light path system comprises: incident angle and/or polarization direction of incident light. The incident light path system can adjust the incident angle of the laser. An impact of the incident angle on the second harmonic is mainly reflected in the P polarization component of the second harmonic. This is because the P component is a sum of the vectors in the incident and vertical directions. Therefore, by adjusting an incident angle, some components in the second-order polarization tensor of the sample being measured can be quantitatively analyzed.

In some embodiments, the present invention provides a device for measuring a semiconductor multilayer structure based on second harmonic: an adjustment range of the incident angle is [100, 90°].

In this embodiment, preferably, the adjustment range of the incidence angle of the laser is [10°, 90°].

In some embodiments, the present invention provides a device for measuring a semiconductor multilayer structure based on second harmonic: a polarization direction of the incident light can be P polarization or S polarization.

In this embodiment, the incident light path system can adjust the polarization direction of the incident laser to be P polarization or S polarization, and in some cases, as described in subsequent embodiments, the emitted light can obtain certain characteristics.

In some embodiments, the present invention provides a device for measuring a semiconductor multilayer structure based on second harmonic: the second harmonic parameters that can be adjusted by the exit optical path system comprises: a polarization direction of an exit light, that is, only the second harmonic with a specified polarization direction is allowed to pass through a half-wave plate.

In this embodiment, the exit optical path system can only let the second harmonic in a specified polarization direction pass through a splitter prism for targeted measurement. In this way, the P polarization component and S polarization component of the second harmonic can be separated for noise reduction and targeted data analysis.

In some embodiments, the present invention provides a device for measuring a semiconductor multilayer structure based on second harmonic: the polarization direction of the exit light is P polarization or S polarization.

In this embodiment, the polarization direction of the exit light is P polarization or S polarization. The second harmonic signal of P polarization is generated by the charge of the oxide layer and interface state in the sample being tested, while the second harmonic signal of S polarization is generated only by the charge excitation of the oxide layer. Therefore, by analyzing the second harmonic signal of different polarization directions, the two electrical characteristics can be decoupled.

In some embodiments, the present invention provides a device for measuring a semiconductor multilayer structure based on second harmonic: the device has one or more signal receiving systems.

In this embodiment, there are one or more of the signal receiving systems. The signal receiving system can use multiple detectors to receive the second harmonic signal and/or the incident beam splitting signal after processed by the exit system and can be used for different functions.

In some embodiments, the present invention provides a device for measuring a semiconductor multilayer structure based on second harmonic: the device has two signal receiving systems: a P signal receiving system and an S signal receiving system. The P signal receiving system only receives the second harmonic signal in P polarization direction. The S signal receiving system only receives the second harmonic signal in S polarization direction.

In this embodiment, there are two of the signal receiving systems, a P signal receiving system and an S signal receiving system, which are respectively used to receive second harmonic signals in P polarization direction and S polarization direction. It is a selective reception of the second harmonic signal.

In some embodiments, the present invention provides a device for measuring a semiconductor multilayer structure based on second harmonic: when the azimuth angle is zero degree and the polarization direction of the incident optical path system is P, the non-zero signal received by the S signal receiving system is used to denoise the second harmonic signal received by the P signal receiving system.

In this embodiment, in the case of zero azimuth, when a polarization direction of the incident light path is P, theoretically no second harmonic in S direction will be generated. However, in the actual measurement, due to the slight deviation of the azimuth angle or the angle of the polarizer, or the influence of other interference factors, the second harmonic signal of the S exit optical path is not zero. Therefore, this signal value can be used for noise reduction processing on the P exit light path. It is worth mentioning that the optical path is not only used for noise reduction, in fact, when adjusting the azimuth angle for measurement, the second harmonic signal in the S direction is also meaningful when analyzing the lattice symmetry or defects of the sample.

In some embodiments, the present invention provides a device for measuring a semiconductor multilayer structure based on second harmonic: the device has three signal receiving systems: a P signal receiving system, an S signal receiving system and an incident beam splitting optical signal system.

In this embodiment, there are three of the signal receiving systems: a P signal receiving system, an S signal receiving system and an incident beam splitting optical signal system. The incident beam splitting optical signal system is a beam directly introduced from the incident light, not a second harmonic signal obtained after measurement.

In some embodiments, the present invention provides a device for measuring a semiconductor multilayer structure based on second harmonic: when the azimuth angle is zero degree, the non-zero signal received by the S signal receiving system is used to denoise the second harmonic signal received by the P signal receiving system, and at the same time, monitoring the stability of the incident beam splitting optical signal system in real time is used for noise reduction.

In this embodiment, there are two ways of noise reduction. When the azimuth angle is zero degree, the non-zero signal received by the S signal receiving system is used to denoise the second harmonic signal received by the P signal receiving system, which is the same as the noise reduction method aforementioned. At the same time, monitoring the stability of the incident beam splitting optical signal system in real time is used for noise reduction. The incident beam splitting optical signal system collects a beam of split light before the incident light reaches the sample and it is mainly used to monitor the fluctuation of the laser power reaching the sample surface, cooperating with the camera system to monitor the shape and size of the spot, it can be used to monitor the light intensity of the spot and use it to denoise the second harmonic signal.

In some embodiments, the present invention provides a device for measuring a semiconductor multilayer structure based on second harmonic: the device also comprises a sample pretreatment system for pretreating the sample to change the internal charge distribution state of the sample.

In this embodiment, the method further comprises changing the initial state of the measurement point in the sample by separate excitation. In some cases, it is necessary to change the initial state of the sample before it is scanned, that is a separate "excitation". The change of the initial state should be uniform and stable, which can be achieved by optical or electrical devices.

In some embodiments, the present invention provides a device for measuring a semiconductor multilayer structure based on second harmonic: the pretreatment system is a pump light source.

In this embodiment, the separate excitation is achieved by another light source, that is, a pump light source. The pump light source excites the electrons inside the sample, so that the electrons gain enough energy to move in the sample, thus achieving a state of electron accumulation at the interface. Therefore, the pump light source is required to have a wide power range and wavelength adjustable function. This technical means is applicable to both scanning and fixed-point measurement and is suitable for both before and during measurement. However, since the pump light source has a small spot, it is directional to excite the point to be measured.

In some embodiments, the present invention provides a device for measuring a semiconductor multilayer structure based on second harmonic: the pretreatment system is a flash lamp.

In this embodiment, the excitation light source is a flash lamp. Compared to a pump light, a flash lamp is full coverage and affects the entire wafer. This technique is applicable to both fixed-point measurement mode and scanning measurement mode and is only applicable before measurement.

In some embodiments, the present invention provides a device for measuring a semiconductor multilayer structure based on second harmonic: the pretreatment system is a field bias device, the field bias device is used for applying a voltage sufficient to change the internal charge distribution state of the sample to the sample.

In this embodiment, the separate excitation is achieved by applying a voltage that is sufficient to change the internal electric field of the sample to be tested to the sample, that is, by adding a bias voltage device to change an initial state of the sample. The method adopts the application of an electric field sufficient to affect the arrangement of internal charges at both ends of the sample, under which charges accumulate at the interface. The final accumulated charge density is not only related to the applied electric field, but also related to other electrical characteristics of the place (such as interface state density, fixed charge density, etc.). After the charge accumulation reaches a stable level, the internal charge distribution of the sample being tested can be effectively detected by a scanning mode, so as to evaluate the electrical characteristics of the entire scanning area. The electric field can be added directly by a DC voltage device, an AC voltage device, etc., or can be added by a magnetic field bias device, a corona device, etc.

A DC voltage device takes advantage of the fact that charges of different polarities respond differently to an electric field. Under the action of DC voltage, movable charges (such as charge carriers, movable ions, etc.) move in a direction of electric field lines and finally accumulate on the interface/surface. In this process, due to the existence of interface state defects or other electrical defects inside the sample, differences in the final accumulation state of the charge are caused, which can be analyzed through the signal feedback of the second harmonic scanning mode. The device can be used before or during the measurement of the second harmonic.

An AC voltage device takes advantage of the fact that different types of charges respond differently to AC voltage. For example, movable charges move periodically with AC voltage (but different types of movable charges move at different speeds or displacements), but fixed charges do not move with it. Even the same type of defect responds differently to voltages of different frequencies. For example, the interface state exhibits low-resistance properties under high-frequency voltages, but high-resistance properties under low-frequency voltages. Therefore, by applying an AC voltage, various electrical characteristics inside the sample can be analyzed in more detail. To ensure the measurement accuracy, the frequency of the AC voltage device is required to be much lower than the signal receiving frequency of the system.

Both of the above two devices, the sample can be placed on a conductive tray (the electrical resistivity is required to be as small as possible), and the tray is grounded; the other end of the sample introduces DC or AC voltage through a non-contact probe or a covered but non-contact conductor plate. In particular, if a conductor plate is used to apply voltage, there should be small holes for light to pass through.

A magnetic field bias device, the sample is placed in a changing magnetic field, a magnetic field induces an electric field, under the action of the electric field, the charge moves inside the sample, so that the sample reaches a state of charge accumulation at the interface. Wherein, the intensity of the applied magnetic field and the induced electric field are described by Maxwell's equation.

A corona device, through a corona device with a high voltage, ionizes the water molecules and carbon dioxide molecules in the surrounding air to produce positive $H_3O_2^-$ ions and negative $CO_3^-$ ions. One type of the ions can be sprayed on the surface of the sample in a targeted manner as needed. In this way, the surface potential of the sample will be changed, and the internal charge of the sample will be attracted or repelled to achieve a purpose of internal charge redistribution.

The various excitation devices in this embodiment may be used in combination with each other or in conjunction with the above-mentioned pump light source or flash lamp. As long as these excitation devices can work independently and do not interfere with each other, it is sufficient.

In many of the solutions described above, the scanning mode itself is independent of the "excitation" device. In an actual measurement process, either the scanning mode can be used alone, or the two can be combined for more forms of measurement. But generally speaking, it takes advantage of the feature that the scanning measurement can characterize an initial interface state of the sample. Meanwhile, the most prominent advantage of the scanning method over a single-point measurement is the increase of measurement points and an improvement of measurement efficiency and accuracy.

In some embodiments, the present invention provides a device for measuring a semiconductor multilayer structure based on second harmonic:
the time-varying characteristics and the space-varying characteristics satisfy simultaneously or respectively:
the time-varying characteristics comprising:
an initial state, characterizing a state of the sample prior to injection of the photons;
a final state, characterizing a state of the sample at the end of the measurement;
a time-varying state, characterizing a dynamic process of an internal charge redistribution of the sample during the injection of the photons;
the space-varying characteristics comprising:
a normal point, that is, the measurement point where a value of the second harmonic signal is within a range of 5% above and below an average value;
an abnormal point, that is, the measurement point where a value of the second harmonic signal is outside a range of 5% above and below the average value.

In this embodiment, the time-varying feature and the space-varying feature may be available at the same time, but not necessarily. Because a fixed-point measurement mode with the time-varying feature and a scanning measurement mode with the space-varying feature can be used successively, at the same time (using the same type of equipment to make the same measurement on the same sample) or can be used separately.

The time-varying feature comprises the initial state, the final state and the time-varying state. The initial state is the initial state of the sample before measurement. The initial state may be the original state of the sample, or a state of the sample after being separately excited. In short, it is a state before measurement. The final state is the state of the sample reached at the end of the measurement. At the end of the measurement, the sample is no longer irradiated, but the state may still continue to change, however, because the device no longer receives new second harmonic signals from it, therefore, for measurement results, only the state at the end can be taken as the final state. Of course, if the measurement time is long enough, it is also possible that the state of the sample has no longer changed at the end of the measurement and has reached a stable state. The time-varying state is a dynamic change process of the sample from the initial state to the final state.

The space-varying feature comprises the normal point and the abnormal point. The value of the second harmonic signal of the normal point is within a range of 5% above and below the average value, that is, in the vicinity of an average value. The value of the second harmonic signal of the abnormal point is outside a range of 5% above and below the average value, that is, it obviously deviates from an average value. The value of 5% is a preferred value provided in this embodiment, and it is also allowed to take other values according to actual conditions.

FIG. 3 and FIG. 7 are an example of this fixed-point measurement mode combined with the scanning measurement mode. Wherein, FIG. 3 shows the fixed-point measurement of some points, and FIG. 7 shows the scanning measurement mode. A fixed-point measurement can be used for a quantitative analysis of defect density being measured, and a scanning mode can be used for a relative measurement of different measuring points. Therefore, by combining the two measurement modes, it can achieve a quantitative analysis of the defect density in the whole area of the sample. FIG. 7 shows an example of the data in a linear scan case. In an actual measurement, different scanning methods can be adopted for different sample types, so the corresponding data processing methods need to be adopted. For example, for a patterned wafer, because an area to be measured is very small (usually only several times the size of the light spot), then the scanning area can be set to be slightly larger than the test piece (a general area is 50 microns×50 microns) when selecting the scanning mode, and the signal points outside the test piece area can be deleted during data processing; for an unpatterned wafer, various measurement methods can be adopted to achieve randomness and diversity of measured points.

In some embodiments, the present invention provides a device for measuring a semiconductor multilayer structure based on second harmonic: the central processing system also comprises a fixed-scanning corresponding module, the fixed-scanning corresponding module is used to establish a correspondence between the fixed-point measurement mode and the scanning measurement mode, that is: when an average value of the second harmonic signal obtained in the scanning measurement mode is the same as an value at the $t_s$ moment of the second harmonic signal obtained in the fixed-point measurement mode, it is considered that the duration for any measurement point to be irradiated by the laser in the scanning measurement mode is the value of $t_s$, expressed as a formula of $$t_s = \frac{D_s}{v},$$

$t_s$ is the duration of the laser irradiation of the specified measuring point on the sample under the fixed-point measurement mode, $D_s/v$ is the duration of the laser irradiation of the scanning measuring point on the sample under the scanning measurement mode, $D_s$ is the equivalent size of the spot, $D_s>0$, v is the relative moving velocity.

In this embodiment, the central processing system also comprises a fixed-scan corresponding module, which is used to establish the corresponding relationship between the fixed-point measurement mode and the scanning measurement mode. It is therefore possible to characterize the electrical properties at the interface of the sample being measured by using the scanning measurement mode combined with the fixed-point measurement mode. The advantage of this measurement method is that it is not only the accurate initial state measured by the scanning mode can be used to denoise the data result of the fixed-point measurement, but also the data of the scanning mode can be reprocessed by the result of the fixed-point measurement mode.

$D_s/v$ is the duration of laser irradiation of the measuring point on the sample after the scanning under the scanning measurement mode. Since both of the equivalent size $D_s$ and the relative moving velocity v remain constant, then the value is a fixed value, that is, corresponding to a specific moment $t_s$ in the fixed-point measurement mode, which needs to be confirmed by calculation or comparison of measurement results. When $D_s/v$ is large, it means $t_s$ is large, at this moment the time of the measuring point being irradiated by the laser in the scanning measurement process is a long time; When $t_s$ is large enough, such as more than 10 s, a final state of the fixed-point measurement mode was achieved by the scanning measurement mode. Generally speaking, for the scanning measurement mode to obtain the final state, the relative moving speed needs to be very slow and is related to the total time of a fixed-point measurement, that is, related to the final state of a fixed-point measurement. When $D_s/v$ is very small, that means $t_s$ is very small, the time of the measuring point being irradiated by the laser in the scanning measurement process is very short; When $t_s$ is small enough, an initial value of the fixed-point measurement mode is achieved by the scan measurement mode.

In some embodiments, the present invention provides a device for measuring a semiconductor multilayer structure based on second harmonic:

the second harmonic signal formula can be described as Formula 1:

$$\sqrt{SH(2\omega)} = \iiint_0^{D_s/2} \int_{-L_D}^0 I(r,\theta)[\chi^{(2)}\delta(z)+\chi^{(3)}E_{dc}(r,t)] \, r \, dz \, dr \, d\theta$$

In Formula 1, $\chi^{(2)}$, $\chi^{(3)}$, respectively, are a second and third order polarization constants of the sample being tested; $D_s$ is the equivalent size of the light spot; $L_D$ is Debye length; $(r,\theta)$ is a polar coordinate position with the center of the light spot as the origin; z is a distance of the light spot from the interface to be measured in a vertical direction; t is a duration of the measuring point being irradiated by the laser.

In Formula 1, $I(r,\theta)$ is Gaussian light intensity distribution of a spot, which can be described by formula 2 as below:

$$I(r, \theta) = \frac{2P}{\pi w^2} \exp\left(-\frac{2r^2}{w^2}\right) \quad \text{(Formula 2)}$$

P in Formula 2 is a peak power of the laser and w is a beam waist width.

$E_{dc}(r,t)$ in Formula 1 is a built-in electric field at the interface to be measured, which can be described by Formula 3 as below:

$$E_{dc} = -\frac{\sqrt{2}kT_e}{qL_D}\exp\left(-\frac{q(V_g - V_{FB})}{2kT_e}\right) + \frac{qN\alpha^{-1}}{\varepsilon_s\varepsilon_0} \quad \text{(Formula 3)}$$

In Formula 3, q is an electron charge constant, k is an Boltzmann constant, $T_e$ is an ambient temperature, $V_g$ is an external bias voltage applied by the bias voltage device, $V_{FB}$ is a flat band voltage, N is a volume charge density, $\alpha^{-1}$ is a penetration depth of the second harmonic signal in the semiconductor layer, $\varepsilon_s$ is a dielectric constant of the semiconductor layer, $\varepsilon_0$ is a vacuum dielectric constant.

In this embodiment, as shown in FIG. 1, it is an ideal and uniform internal charge distribution change of the sample when it is irradiated by laser in two modes of a fixed-point measurement and a scanning measurement. Wherein, FIG. 1A is the fixed-point measurement mode. It can be seen that since the light intensity in the measurement area presents a Gaussian distribution, the laser-induced internal charge redistribution also presents a Gaussian distribution. Therefore, data processing can no longer be analyzed by the formulas published in the existing literature, but should be analyzed by Formula 1, Formula 2 and Formula 3. Formula 1 is a further generalization of the general formula for the second harmonic $I_{2\omega}=|\chi^{(2)}+\chi^{(3)}e^{i\varphi}E_{dc}(t)|^2 I_\omega^2$. Wherein, $\chi^{(2)}$ and $\chi^{(3)}$ are a second/third order polarization tensor of the sample, respectively, $I_\omega$ is the light intensity at the measurement point, $E_{dc}(t)$ is the built-in electric field at the interface, and $\varphi$ is the phase difference of the two terms. As mentioned above, because the light intensity is no longer uniformly distributed, and the electric field intensity changes in the measurement area are also different, this embodiment proposes a new formula, that is, Formula 1. In Formula 1, the built-in electric field is the most important parameter, and it is the most fundamental cause of the time-varying second harmonic signal.

Formula 2 is an existing formula of intensity distribution of Gaussian spot. However, in the existing second harmonic technology, the light intensity distribution is always calculated as a uniform light spot, which brings errors in an actual measurement. Therefore, the present invention introduces the existing formula to establish a more accurate physical model.

The electric field formula of Formula 3 fits for the scanning measurement mode better. Because the distribution of incident photons in the scanning process is uniform, so is the charge accumulation, which is consistent with the theoretical model in Formula 3. Here, two values that need special attention, $V_g$ is the voltage applied through the voltage bias device, which is sufficient to change the initial state of the sample under test; and N is the accumulated charge density at the interface in the measurement process, which is the change of charge distribution at the interface caused by the capture of electrons by interface states or fixed charges during the movement process. Formula 3 is a further extension of the second harmonic formula of the invention and a more accurate description of the built-in electric field at the semiconductor interface. In the existing second harmonic technology, it is believed that the change of the built-in electric field comes from the charge accumulation at the interface, but in fact, the built-in electric field should be the result of various electrical defects and charge accumulation. Whereas the effect of electrical defects can be described by the flat-band voltage (i.e., the first item on the right of Formula 3), which can be adjusted by the external voltage; the effect of charge accumulation can be described by the second term on the right of Formula 3. Therefore, it can be seen that the model described by Formula 3 is closer to a real situation, so it can better describe the fixed-point measurement model.

The purpose of the combination of the scanning measurement mode and the bias voltage technique is to change the initial built-in electric field of the sample being tested, that is, $E_{dc}$ in Formula 3. The advantages brought by this combination to the measurement are: 1) it can improve the signal-to-noise ratio of the signal; 2) it can make the measured sample in different working states (majority carrier accumulation state, majority carrier depletion state, minority carrier accumulation state, inversion), so as to make a more accurate analysis to the property of the sample; 3) by adding different bias voltages, measure the movable charge (such as Na$^+$) in the oxide layer: when $V_g$ is positive, the movable charge moves to the interface; when $V_g$ is negative, the movable charges move toward the surface.

Formula 1, formula 2 and formula 3 provided by the invention are used for calculation, so that the actual measurement results and theoretical model are unified under the three modes of a fixed-point measurement, a scanning measurement, and the combination of a fixed-point measurement and a scanning measurement, so that the second harmonic measurement technology is no longer only a qualitative analysis method, but can be applied as a quantitative analysis method.

In some embodiments, the present invention provides a device for measuring a semiconductor multilayer structure based on second harmonic: the central processing system comprises a scanning signal diagram making module, the scanning signal diagram making module is used to make a scanning signal diagram, the scanning signal diagram takes the scanning direction as an abscissa and takes a value of the second harmonic signal as an ordinate. in the scanning signal diagram, signal peaks and signal valleys are abnormal points of data. The defect density at the abscissa of the peak value corresponding to the signal peak is larger than that of the surrounding area, the abscissa of the peak value is a defect center, a width of the signal peak is a size width of the defect at this place, and a height of the signal peak is used to characterize a defect density. The defect density at the abscissa of the valley value corresponding to the signal valley is smaller than that of the surrounding area, the abscissa of the valley value is a defect center, a width of the signal valley is a size width of the defect at this place, and a height of the signal valley is used to characterize a defect density.

In this embodiment, the scanning signal diagram produced by the scanning signal diagram making module is shown in FIG. 7, the abscissa is the coordinate of scanning direction, and the ordinate is the second harmonic signal obtained by scanning. Since the second harmonic signal is related to the defect density, the defect density at the abscissa of the peak value corresponding to the signal peak in the diagram is larger than that around it, the abscissa of the peak value is the defect center, the width of the signal peak is the size width of the defect at this place, and the height of the signal peak is used to characterize the defect density; the defect density at the abscissa of the valley value corresponding to the signal valley is smaller than the surrounding area, the abscissa of valley value is the defect center, the width of signal valley is the size width of the defect at this place, and the height of signal valley is used to characterize the defect density. Therefore, the relative defect distribution of the sample can be measured by scanning mode.

In some embodiments, the present invention provides a device for measuring a semiconductor multilayer structure based on second harmonic, the device also comprises a defect density distribution diagram making module, a defect density distribution diagram making module is used to make a defect density distribution diagram according to the second harmonic signal value and a coordinate position of the scanning measuring point of the scanning measurement mode, in the defect density distribution diagram, a bright spot corresponds to the signal peak in the scanning signal diagram, indicating that the defect density of the coordinate position of the scanning measuring point corresponding to the bright spot is larger than the surrounding area. A dark spot corresponds to the signal valley in the scanning signal diagram, indicating that the defect density of the coordinate position of the scanning measuring point corresponding to the dark spot is smaller than the surrounding area.

In this embodiment, as shown in FIG. 8, it is a defect density distribution diagram after the scanning measurement mode. Wherein, the defect density at the bright spot is larger than the surrounding area, corresponding to the peak in FIG. 7; the defect density at the dark spot is smaller than the surrounding area, corresponding to the valley in FIG. 7.

In some embodiments, the present invention provides a device for measuring a semiconductor multilayer structure based on second harmonic, the device also comprises a time-varying second harmonic signal diagram making module, the time-varying second harmonic signal diagram making module is used to take a measurement time as an abscissa and take a value as an ordinate, in the fixed-point measurement mode, to make a time-varying second harmonic signal diagram.

The time-varying second harmonic signal diagram has the following characteristics:
the initial state point is the first point in the time-varying second harmonic signal diagram, which characterizes a state of the sample before injecting the photons;
the final state point is the last point in the time-varying second harmonic signal diagram, which characterizes a state of the sample at the end of the measurement;
the time-varying state point is a point between the initial state point and the final state point in the time-varying second harmonic signal diagram, which characterizes a dynamic process of the internal charge redistribution of the sample during the photon injection process.

In this embodiment, it involves three most concerned aspects in an entire time-varying second harmonic curve: an initial state, a final state, and a time-varying state.

An initial state point characterizes a state of the sample before it is injected with photons, that is, the first point in FIGS. 3A, 3B, 3C and 3D. At this time, no free electrons have been excited into the oxide layer, and the built-in electric field at this time is an initial built-in electric field.

A time-varying state point characterizes a dynamic process of charge redistribution in the sample after photon injection, reflecting the process of electron capture by interface state or bulk charge. This is reflected in the changing line segment in the middle in FIGS. 3A, 3B, 3C and 3D. During this process, the built-in electric field changes, producing a time-varying second harmonic signal. The rate of signal change is related to the thickness of the oxide layer, the band gap width of the material and the frequency of the incident photon, etc. Taking silicon as an example, Formula 4 can be used to calculate the growth rate of the second harmonic curve when the interface charge density is σ.

$$\frac{1}{\tau_g(\sigma)} = \frac{1}{\tau_g(0)}\left[1 - \frac{e^2 \sigma D_{e\!f\!f}}{\varepsilon_{Si}(n\hbar\omega - \emptyset_{ox})}\right] \quad \text{(Formula 4)}$$

Wherein, $\varepsilon_{Si}$ is a dielectric constant of silicon, n is the number of photons absorbed by the electron energy level transition, $\hbar$ is a reduced Planck constant, co is an angular frequency of light, $\emptyset_{ox}$ is a band gap width of the oxide layer, e is an electron charge constant, σ is an interface charge surface density, $D_{e\!f\!f}$ is an oxide layer thickness. It can be seen from Formula 4 that when the oxide layer thickness exceeds a threshold, Formula 4 approaches 0, and the second harmonic signal generated no longer changes over time. Therefore, for a thicker oxide layer, the probability of electronic energy level transition and reaching the surface of the oxide layer can be increased by increasing the frequency of incident photons.

A final state point characterizes a state of the sample after photon injection and reaching stability or a state at the end of measurement time. The so-called stable means that, within the measurement time, the excitation and recombination of new free electrons reach a balance, the internal charge distribution of the sample reaches a dynamic balance, and the built-in electric field does not change anymore. After that, even if the measurement time is extended, the signal value will not change significantly again, which is reflected in the line segment after signal stabilization in FIGS. 3B, 3C and 3D. However, in the case of using a low power excitation light, it is possible that the sample still does not reach a stable state at the end of the measurement, and thereafter if the measurement time is extended, the second harmonic signal will still show a tendency to change over time. In this case, the last point measured can be defined as a final state, as the last point marked in FIG. 3A.

In some embodiments, the present invention provides a device for measuring a semiconductor multilayer structure based on second harmonic: the central processing system also comprises a point selection analysis module, the point selection analysis module is used to select part or all of the signal abnormal points and/or randomly select measurement points in advance as the specified measurement points and enter the fixed-point measurement mode.

In this embodiment, random points and/or special points can be selected for the location of the fixed-point measurement. Random points are selected randomly before measurement and are mainly used to calculate the defect density. Special points mean that during the measurement process, the abnormal point (peak or valley) of the signal will be measured at a fixed point, and the purpose is to carry out more detailed measurement and analysis on this point. Random points and special points can be measured separately. When random and special points are measured together, they can be analyzed separately or together during subsequent analysis.

As shown in FIG. 9, it is a flow chart of a specific measurement process based on the comprehensive use of the techniques provided by the foregoing embodiments. The measurement steps: put in the wafer, adjust the parameters, select the scanning line, move the carrier platform and measure until all the scanning measurement tasks are completed, analyze the abnormal points, and enter the fixed-point measurement mode. After all measurements are completed, data analysis is performed.

The invention claimed is:
1. A method for measuring a semiconductor multilayer structure based on second harmonic, the method comprising:
emitting a laser, by a light source, wherein the laser passes through an incident optical path system, forms a light spot on a sample, and injects photons into the sample to carry out a laser irradiation on the sample;
the sample is a detectable structure consisting of more than 2 layers of substance, at least one layer of the substance is a semiconductor layer, the light source reaches an interface to be probed;

the sample and the light spot have a relative movement on a plane, a relative movement speed of the relative movement is v, v≥0; when the method enters a fixed-point measurement mode in which a specified measurement point is measured, v=0; when the method enters a scanning measurement mode, v>0, a direction of the relative movement is a scanning direction, wherein, in the scanning measurement mode, a laser-induced charge distribution of the sample is uniform and a total duration of irradiation and a total number of said photons injected is the same for all measurement points on the sample;

during a scanning measurement process of a same batch of the sample, a shape and size of the light spot remain constant; a power of the light source remains constant such that, when the shape and size of the light spot remain constant, a light intensity of the light spot also remains constant; the relative moving speed of the sample and the light spot remains constant;

when the photon is absorbed by an electron and an internal charge distribution of the sample changes, a change curve of the second harmonic signal received by a signal receiver through an exit optical path system can be described as a second harmonic signal formula; the second harmonic signal is a filtered light of a single wavelength, and an exit angle is the same as an incidence angle;

the change curve of the second harmonic signal, comprising the following information:

when entering the fixed-point measurement mode, the time variation characteristics of the second harmonic signal generated by the specified measuring point are recorded;

when entering the scanning measurement mode, the spatial distribution characteristics of the second harmonic signal generated by a scanning measuring point in the process of the relative movement are recorded.

2. The method according to claim 1, the relative movement of the sample and the light spot on the plane has a degree of freedom in X direction.

3. The method according to claim 2, the relative movement also has a degree of freedom in Y direction.

4. The method according to claim 1, the relative movement also comprises rotation.

5. The method according to claim 1, the relative movement is linear.

6. The method according to claim 1, the relative movement is arcuate.

7. The method according to claim 1, wherein an azimuth angle of the sample can be adjusted within a range of [0°, 360°] by rotating the sample.

8. The method according to claim 1, a relative position of the sample and the spot can be adjusted in Z direction.

9. The method according to claim 1, the power of the laser emitted by the light source can be adjusted.

10. The method according to claim 9, an adjustment range of the power of the laser is [0, 1000 mW].

11. The method according to claim 1, the incident light path system can adjust the incident angle of the laser.

12. The method according to claim 11, an adjustment range of the incident angle of the laser is [10°, 90°].

13. The method according to claim 1, the incident optical path system can adjust a polarization direction of the laser to be P polarization or S polarization.

14. The method according to claim 1, wherein the signal receiver is a signal receiving system that is one of a plurality of signal receiving systems that receive the second harmonic signal.

15. The method according to claim 14, wherein the plurality of signal receiving systems include a P signal receiving system and an S signal receiving system; wherein the P signal receiving system only receives the second harmonic signal in a P polarization direction; and the S signal receiving system only receives the second harmonic signal in an S polarization direction.

16. The method according to claim 15, wherein when an azimuth angle of the sample is zero degree and a polarization direction of the incident optical path system is P, and a non-zero signal received by the S signal receiving system is used to denoise the second harmonic signal received by the P signal receiving system.

17. The method according to claim 14, wherein the plurality of signal receiving systems include a P signal receiving system, an S signal receiving system and an incident beam splitting optical signal system.

18. The method according to claim 17, wherein when an azimuth angle of the sample is zero degree, a non-zero signal received by the S signal receiving system is used to denoise the second harmonic signal received by the P signal receiving system, and, at the same time, a stability of the incident beam splitting optical signal system is monitored in real time for noise reduction.

19. The method according to claim 1, the method still comprises changing the state of the internal charge distribution at the measurement point in the sample by a separate excitation.

20. The method according to claim 19, the separate excitation is achieved by a pump light source.

21. The method according to claim 19, the separate excitation is achieved by a flash lamp.

22. The method according to claim 19, the separate excitation is achieved by applying a voltage, which is sufficient to change a built-in electric field of the sample, to the sample through a bias voltage device.

23. The method according to claim 22, the time-varying characteristics and the space-varying characteristics satisfy simultaneously or respectively:

the time-varying characteristics comprising:

an initial state, characterizing a state of the sample prior to injection of the photons;

a final state, characterizing a state of the sample at the end of the measurement;

a time-varying state, characterizing a dynamic process of internal charge redistribution of the sample during the injection of the photons;

the space-varying characteristics comprising:

a normal point; and an abnormal point.

24. The method according to claim 23, the method comprising: select part or all of the signal abnormal points as the specified measurement points and enter the fixed-point measurement mode.

25. The method according to claim 23, the method comprising: randomly select the measurement points in advance as the specified measurement points, and enter the fixed-point measurement mode.

26. The method according to claim 23, wherein the method still-comprises a fixed-scanning correspondence, the fixed-scanning correspondence is a corresponding relationship between the fixed-point measurement mode and the scanning measurement mode such that, when an average value of the second harmonic signal obtained in the scanning measurement mode is the same as an value at the $t_s$ moment of the second harmonic signal obtained in the fixed-point measurement mode, it is considered that the duration for any measurement point in the scanning measurement mode to be irradiated by the laser is $t_s$, expressed by a formula of $$t_s = \frac{D_s}{v},$$

$t_s$ is the duration of the laser irradiation of the specified measuring point on the sample under the fixed-point measurement mode, $D_s/v$ is the duration of the laser irradiation of the scanning measuring point on the sample under the scanning measurement mode, $D_s$ is an equivalent size of the spot, $D_s>0$, v is the relative moving velocity.

27. The method according to claim 26, the second harmonic signal formula can be described as Formula 1:

$$\sqrt{SH(2\omega)} = \oiint_0^{D_s/2} \int_{-L_D}^{0} I(r,\theta)[\chi^{(2)}\delta(z)+\chi^{(3)}E_{dc}(r,t)] \, rdzdrd\theta$$

in the Formula 1, $\chi^{(2)}$, $\chi^{(3)}$, respectively, are a second and third order polarization constants of the sample being tested; $D_s$ is the size of the light spot; $L_D$ is Debye length; (r, θ) is a polar coordinate position with the center of the light spot as the origin; z is a distance of the light spot from the interface to be measured in a vertical direction; t is a duration of the measuring point being irradiated by the laser; SH denotes the second harmonic, ω is an angular frequency of an incident photon; SH(2ω) denotes light intensity density of the second harmonic with an angular frequency of 2ω; and δ(z) denotes a Dirac delta function at the distance z;

in the Formula 1, I(r, θ) is Gaussian light intensity distribution of a light spot, which can be described by Formula 2 as follows:

$$I(r, \theta) = \frac{2P}{\pi w^2} \exp\left(-\frac{2r^2}{w^2}\right) \quad \text{(Formula 2)}$$

P in the Formula 2 is a peak power of the laser and w is a beam waist width;

$E_{dc}(r, t)$ in Formula 1 is a built-in electric field at the interface to be measured, which can be described by Formula 3 as follows:

$$E_{dc} = -\frac{\sqrt{2}\,kT_e}{qL_D} \exp\left(-\frac{q(V_g - V_{FB})}{-2kT_e}\right) + \frac{qN\alpha^{-1}}{\varepsilon_s \varepsilon_0} \quad \text{(Formula 3)}$$

in the Formula 3, q is an electron charge constant, k is an Boltzmann constant, $T_e$ is an ambient temperature, $V_g$ is an external bias voltage applied by the bias voltage device, $V_{FB}$ is a flat band voltage, N is a volume charge density, $\alpha^{-1}$ is a penetration depth of the second harmonic signal in the semiconductor layer, $\varepsilon_s$ is a dielectric constant of the semiconductor layer, $\varepsilon_0$ is a vacuum dielectric constant.

28. The method according to claim 27, the method comprising:
in the fixed-point measurement mode, a measurement time is taken as an abscissa, and a value of the second harmonic signal as an ordinate to make a time-varying second harmonic signal diagram;
the time-varying second harmonic signal diagram has the following characteristics:
an initial state point is a first point in the time-varying second harmonic signal diagram, which characterizes a state of the sample before injecting the photons;
a final state point is a last point in the time-varying second harmonic signal diagram, which characterizes a state of the sample at the end of the measurement;
a time-varying state point is a point between the initial state point and the final state point in the time-varying second harmonic signal diagram, which characterizes a dynamic process of the internal charge redistribution of the sample during the photon injection process.

29. The method according to claim 27, the method comprising:
after measurement in the scanning mode, the scanning direction is taken as an abscissa, and the value of the second harmonic signal is taken as an ordinate to do a scanning signal diagram;
in the scanning signal diagram, signal peaks and signal valleys are abnormal points;
the defect density at the abscissa of the peak value corresponding to the signal peak is larger than that of the surrounding area, the abscissa of the peak value is a defect center, a width of the signal peak is a size width of the defect at this place, and a height of the signal peak is used to characterize a defect density;
the defect density at the abscissa of the valley value corresponding to the signal valley is smaller than that of the surrounding area, the abscissa of the valley value is a defect center, a width of the signal valley is a size width of the defect at this place, and a height of the signal valley is used to characterize a defect density.

30. The method according to claim 29, the method comprising:
a defect density distribution diagram is made according to a value of the second harmonic signal and a coordinate position of the scanning measuring point of the scanning measurement mode;
in the defect density distribution diagram, a bright spot corresponds to the signal peak in the scanning signal diagram, indicating that the defect density of the coordinate position of the scanning measuring point corresponding to the bright spot is larger than the surrounding area; a dark spot corresponds to the signal valley in the scanning signal diagram, indicating that the defect density of the coordinate position of the scanning measuring point corresponding to the dark spot is smaller than the surrounding area.

31. The method according to claim 26, when a speed of the relative movement is $$v \geq \frac{D_s}{T},$$

the average value of the second harmonic signal in the scanning measurement mode corresponds to a value of an initial state in the fixed-point measurement mode, and T is an interval time for the signal receiving systems to collect signals, $D_s$ is an equivalent size of the light spot, and v is the relative moving speed.

32. A device for measuring a semiconductor multilayer structure based on second harmonic, the device comprising:
a light source configured to emit a laser, wherein the laser is configured to form a light spot on a sample through an incident optical path system and inject photons into the sample to carry out a laser irradiation on the sample;

the incident light path system is used to adjust beam parameters of the laser emitted by the light source;

the sample is a detectable structure with an interface composed of two or more layers of substances, at least one layer of the substance is a semiconductor layer, and the light source can reach an interface to be probed;

a carrier platform is used to carry and move the sample on a plane, and a speed of the plane movement is v, v≥0; when the device enters a fixed-point measurement mode and the specified measurement point is measured, v=0; when the device enters a scanning measurement mode, v>0, a direction of the plane moving is a scanning direction, wherein, in the scanning measurement mode, a laser-induced charge distribution of the sample is uniform and a total duration of irradiation and a total number of said photons injected is the same for all measurement points on the sample;

an exit optical path system is used to adjust second harmonic parameters of the outgoing second harmonic;

a signal receiving system is used to receive a second harmonic signal adjusted by the exit optical path system, a change curve of the second harmonic signal can be described as a second harmonic signal formula; the change curve of the second harmonic signal, comprising the following information: when entering the fixed-point measurement mode, the time varying characteristics of the second harmonic signal generated by the specified measuring point are recorded; when entering the scanning measurement mode, the spatial distribution characteristics of the second harmonic signal generated by the scanning measuring point in the process of the relative movement are recorded;

a monitoring system is used for real-time monitoring of a running state of the device and sending real-time feedback information;

an input system is used to receive a user's input information in a human-computer interaction;

a display system is used for displaying an output information of the device in a human-computer interaction;

a central processing system is used for receiving the input information and the real-time feedback information, controlling the running of the device, processing the second harmonic signal according to the second harmonic signal formula, and outputting the output information;

wherein the device is configured such that, during a scanning measurement process of a same batch of the sample implemented by the device, a shape and size of the spot remain constant; a power of the light source remains constant such that, that is, when the shape and size of the light spot remain constant, a light intensity of the light spot also remains constant; the relative moving speed of the sample and the light spot remains constant.

33. The device according to claim 32, the plane movement of the carrier platform has a degree of freedom in X direction.

34. The device according to claim 33, the plane movement of the carrier platform has a degree of freedom in Y direction.

35. The device according to claim 32, the carrier platform can also rotate.

36. The device according to claim 32, a position of the carrier platform in a height direction can be adjusted.

37. The device according to claim 36, in the scanning measurement mode, according to real-time feedback of a height of the measurement point of the sample, the position of the carrier platform adjusted in real time correspondingly in the height direction.

38. The device according to claim 32, the plane movement is linear.

39. The device according to claim 32, the plane movement is arcuate.

40. The device according to claim 32, wherein an azimuth angle of the sample can be adjusted by rotating the carrier platform.

41. The device according to claim 40, an adjustment range of the azimuth angle is [0°, 360°].

42. The device according to claim 32, the device can make a duration of the measuring point of the sample irradiated by the laser in a range of [0.1 ms, 1 ms] by adjusting the scanning size of the light spot and the moving speed of the carrier platform.

43. The device according to claim 32, a power of the light source can be adjusted.

44. The device according to claim 43, a power range of the light source is [0, 1000 mW].

45. The device according to claim 32, wherein light beam parameters that can be adjusted by the incident light path system comprise: an incident angle and/or an incident light polarization direction.

46. The device according to claim 45, an adjustment range of the incident angle is [10°, 90°].

47. The device according to claim 45, a polarization direction of the incident light can be P polarization or S polarization.

48. The device according to claim 32, the second harmonic parameters that can be adjusted by the exit optical path system comprising: a polarization direction of an exit light configured such that only second harmonic with a specified polarization direction is allowed to pass through a half-wave plate.

49. The device according to claim 48, a polarization direction of the exit light is P polarization or S polarization.

50. The device according to claim 32, wherein the signal receiving system is one of a plurality of signal receiving systems that receive the second harmonic signal.

51. The device according to claim 50, wherein the plurality of signal receiving systems are two signal receiving systems which are a P signal receiving system and an S signal receiving system; wherein the P signal receiving system only receives the second harmonic signal in a P polarization direction; and the S signal receiving system only receives the second harmonic signal in an S polarization direction.

52. The device according to claim 51, wherein when an azimuth angle of the sample is zero degree and a polarization direction of the incident optical path system is P, a non-zero signal received by the S signal receiving system is used to denoise the second harmonic signal received by the P signal receiving system.

53. The device according to claim 50, wherein the plurality of signal receiving systems are the device has three signal receiving systems, which are a P signal receiving system, a S signal receiving system and an incident beam splitting optical signal system.

54. The device according to claim 53, wherein when an azimuth angle of the sample is zero degree, a non-zero signal received by the S signal receiving system is used to denoise the second harmonic signal received by the P signal receiving system, and, at the same time, a stability of the incident beam splitting optical signal system is monitored in real time for noise reduction.

55. The device according to claim 32, the device also comprises a sample pretreatment system for pretreating the sample to change an internal charge distribution state of the sample.

56. The device according to claim 55, the pretreatment system is a pump light source.

57. The device according to claim 55, the pretreatment system is a flash lamp.

58. The device according to claim 55, the pretreatment system is a field bias device, the field bias device is used for applying a voltage sufficient to change the internal charge distribution state of the sample to the sample.

59. The device according to claim 58,
the time-varying characteristics and the space-varying characteristics satisfy simultaneously or respectively:
the time-varying characteristics comprising:
an initial state, characterizing a state of the sample prior to injection of the photons;
a final state, characterizing a state of the sample at the end of the measurement;
a time-varying state, characterizing a dynamic process of internal charge redistribution of the sample during the injection of the photons;
the space-varying characteristics comprising:
a normal point; and
an abnormal point.

60. The device according to claim 59, the central processing system also comprises a fixed-scanning corresponding module, the fixed-scanning corresponding module is used to establish a correspondence between the fixed-point measurement mode and the scanning measurement mode such that, when an average value of the second harmonic signal obtained in the scanning measurement mode is the same as an value at the $t_s$ moment of the second harmonic signal obtained in the fixed-point measurement mode, it is considered that the duration for any measurement point in the scanning measurement mode to be irradiated by the laser is $t_s$, expressed by a formula of $$t_s = \frac{D_s}{v},$$

$t_s$ is the duration of the laser irradiation of the specified measuring point on the sample under the fixed-point measurement mode, $D_s/v$ is the duration of the laser irradiation of the scanning measuring point on the sample under the scanning measurement mode, $D_s$ is an equivalent size of the spot, $D_s>0$, v is the relative moving velocity.

61. The device according to claim 60, the second harmonic signal formula is the following Formula 1:

$$\sqrt{SH(2\omega)} = \oiint_0^{D_s/2} \int_{-L_D}^0 I(r,\theta)[\chi^{(2)}\delta(z)+\chi^{(3)}E_{dc}(r,t)] \, rdzdrd\theta$$

in the Formula 1, $\chi^{(2)}$, $\chi^{(3)}$, respectively, are a second and third order polarization constants of the sample being tested; $D_s$ is the size of the light spot; $L_D$ is Debye length; (r, θ) is a polar coordinate position with the center of the light spot as the origin; z is a distance of the light spot from the interface to be measured in a vertical direction; t is a duration of the measuring point being irradiated by the laser; SH denotes the second harmonic, ω is an angular frequency of an incident photon; SH(2ω) denotes light intensity density of the second harmonic with an angular frequency of 2ω; and δ(z) denotes a Dirac delta function at the distance z;
in the Formula 1, I(r, θ) is Gaussian light intensity distribution of a light spot, which can be described by Formula 2 as follows:

$$I(r, \theta) = \frac{2P}{\pi w^2}\exp\left(-\frac{2r^2}{w^2}\right) \quad \text{(Formula 2)}$$

P in the Formula 2 is a peak power of the laser and w is a beam waist width;
$E_{dc}(r, t)$ in Formula 1 is a built-in electric field at the interface to be measured, which can be described by Formula 3 as follows:

$$E_{dc} = -\frac{\sqrt{2}kT_e}{qL_D}\exp\left(-\frac{q(V_g - V_{FB})}{2kT_e}\right) + \frac{qN\alpha^{-1}}{\varepsilon_s\varepsilon_0} \quad \text{(Formula 3)}$$

in the Formula 3, q is an electron charge constant, k is an Boltzmann constant, $T_e$ is an ambient temperature, $V_g$ is an external bias voltage applied by a bias voltage device, $V_{FB}$ is a flat band voltage, N is a volume charge density, $\alpha^{-1}$ is a penetration depth of the second harmonic signal in the semiconductor layer, $\varepsilon_s$ is a dielectric constant of the semiconductor layer, $\varepsilon_0$ is a vacuum dielectric constant.

62. The device according to claim 61, the central processing system comprising a scanning signal diagram making module, the scanning signal diagram making module is used to make a scanning signal diagram, the scanning signal diagram takes the scanning direction as an abscissa, and takes a value of the second harmonic signal as an ordinate; in the scanning signal diagram, signal peaks and signal valleys are abnormal points; the defect density at the abscissa of the peak value corresponding to the signal peak is larger than that of the surrounding area, the abscissa of the peak value is a defect center, a width of the signal peak is a size width of the defect at this place, and a height of the signal peak is used to characterize a defect density; the defect density at the abscissa of the valley value corresponding to the signal valley is smaller than that of the surrounding area, the abscissa of the valley value is a defect center, a width of the signal valley is a size width of the defect at this place, and a height of the signal valley is used to characterize a defect density.

63. The device according to claim 62, the device also comprises a defect density distribution diagram making module, the defect density distribution diagram making module is used to make a defect density distribution diagram according to the second harmonic signal value and a coordinate position of the scanning measuring point of the scanning measurement mode, in the defect density distribution diagram, a bright spot corresponds to the signal peak in the scanning signal diagram, indicating that the defect density of the coordinate position of the scanning measuring point corresponding to the bright spot is larger than the surrounding area; a dark spot corresponds to the signal valley in the scanning signal diagram, indicating that the defect density of the coordinate position of the scanning measuring point corresponding to the dark spot is smaller than the surrounding area.

64. The device according to claim 61, the device also comprises a time-varying second harmonic signal diagram making module, the time-varying second harmonic signal diagram making module is used to take a measurement time as an abscissa and take a value of the second harmonic signal as an ordinate, in the fixed-point measurement mode, to make a time-varying second harmonic signal diagram;

the time-varying second harmonic signal diagram has the following characteristics:

an initial state point is a first point in the time-varying second harmonic signal diagram, which characterizes a state of the sample before injecting the photons;

a final state point is a last point in the time-varying second harmonic signal diagram, which characterizes a state of the sample at the end of the measurement;

a time-varying state point is a point between the initial state point and the final state point in the time-varying second harmonic signal diagram, which characterizes a dynamic process of the internal charge redistribution of the sample during the photon injection process.

65. The device according to claim 59, the central processing system also comprises a point selection analysis module, the point selection analysis module is used to select part or all of the signal abnormal points and/or randomly selected measurement points in advance as the specified measurement points and enter the fixed-point measurement mode.

* * * * *